US012648305B2

(12) United States Patent
Mimura et al.

(10) Patent No.: US 12,648,305 B2
(45) Date of Patent: Jun. 2, 2026

(54) DISPLAY DEVICE AND METHOD FOR MANUFACTURING DISPLAY DEVICE

(71) Applicant: Magnolia White Corporation, Tokyo (JP)

(72) Inventors: Toshifumi Mimura, Tokyo (JP); Noriyuki Hirata, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 517 days.

(21) Appl. No.: 18/174,660

(22) Filed: Feb. 27, 2023

(65) Prior Publication Data

US 2023/0284482 A1     Sep. 7, 2023

(30) Foreign Application Priority Data

Mar. 1, 2022     (JP) ................................. 2022-030945

(51) Int. Cl.
| | |
|---|---|
| *H10K 59/122* | (2023.01) |
| *H10K 59/12* | (2023.01) |
| *H10K 59/80* | (2023.01) |

(52) U.S. Cl.
CPC ....... *H10K 59/122* (2023.02); *H10K 59/1201* (2023.02); *H10K 59/873* (2023.02)

(58) Field of Classification Search
None
See application file for complete search history.

(56) References Cited

U.S. PATENT DOCUMENTS

| | | | | |
|---|---|---|---|---|
| 10,720,599 | B2 * | 7/2020 | Kim | .................. H10K 59/80515 |
| 12,239,003 | B2 * | 2/2025 | Lin | ..................... H10K 59/1315 |
| 2002/0140041 | A1 | 10/2002 | Endoh | |
| 2004/0160170 | A1 | 8/2004 | Sato et al. | |
| 2009/0009069 | A1 | 1/2009 | Takata | |
| 2012/0228603 | A1 * | 9/2012 | Nakamura | ........... H10K 50/824 |
| | | | | 257/40 |
| 2019/0131365 | A1 * | 5/2019 | Jung | .................. H10K 59/8722 |
| 2019/0363275 | A1 | 11/2019 | Ochi et al. | |

FOREIGN PATENT DOCUMENTS

| | | |
|---|---|---|
| JP | 2000-195677 A | 7/2000 |
| JP | 2002-299604 A | 10/2002 |
| JP | 2004-207217 A | 7/2004 |
| JP | 2008-135325 A | 6/2008 |
| JP | 2009-32673 A | 2/2009 |
| JP | 2009-158762 A | 7/2009 |
| JP | 2010-118191 A | 5/2010 |
| WO | 2018/179308 A1 | 10/2018 |

* cited by examiner

*Primary Examiner* — Michelle Mandala
(74) *Attorney, Agent, or Firm* — XSENSUS LLP

(57) ABSTRACT

According to one embodiment, a display device includes a first lower electrode and a second lower electrode, a rib, a partition including a lower portion and an upper portion, a first organic layer disposed on the first lower electrode, a second organic layer disposed on the second lower electrode, a first upper electrode disposed on the first organic layer, a second upper electrode disposed on the second organic layer, a first sealing layer disposed above the first upper electrode, and a second sealing layer disposed above the second upper electrode. A thickness of the first sealing layer directly above the first lower electrode is 0.5 times or more, and less than twice a thickness of the lower portion of the partition.

10 Claims, 16 Drawing Sheets

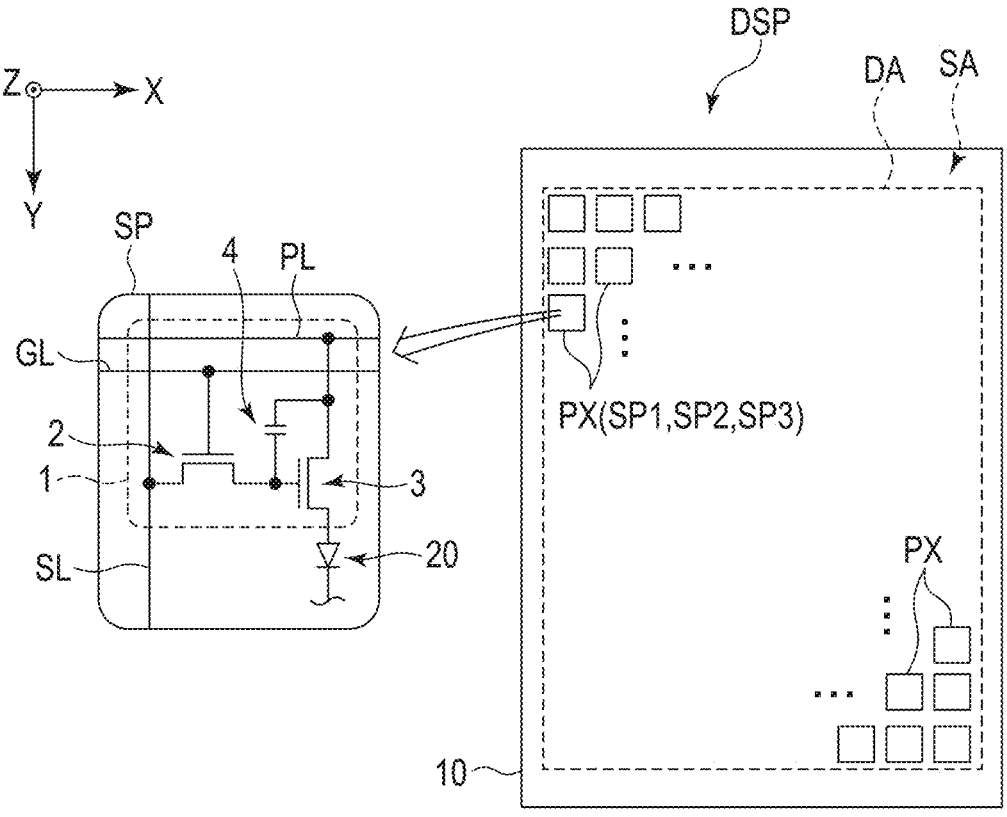
F I G. 1

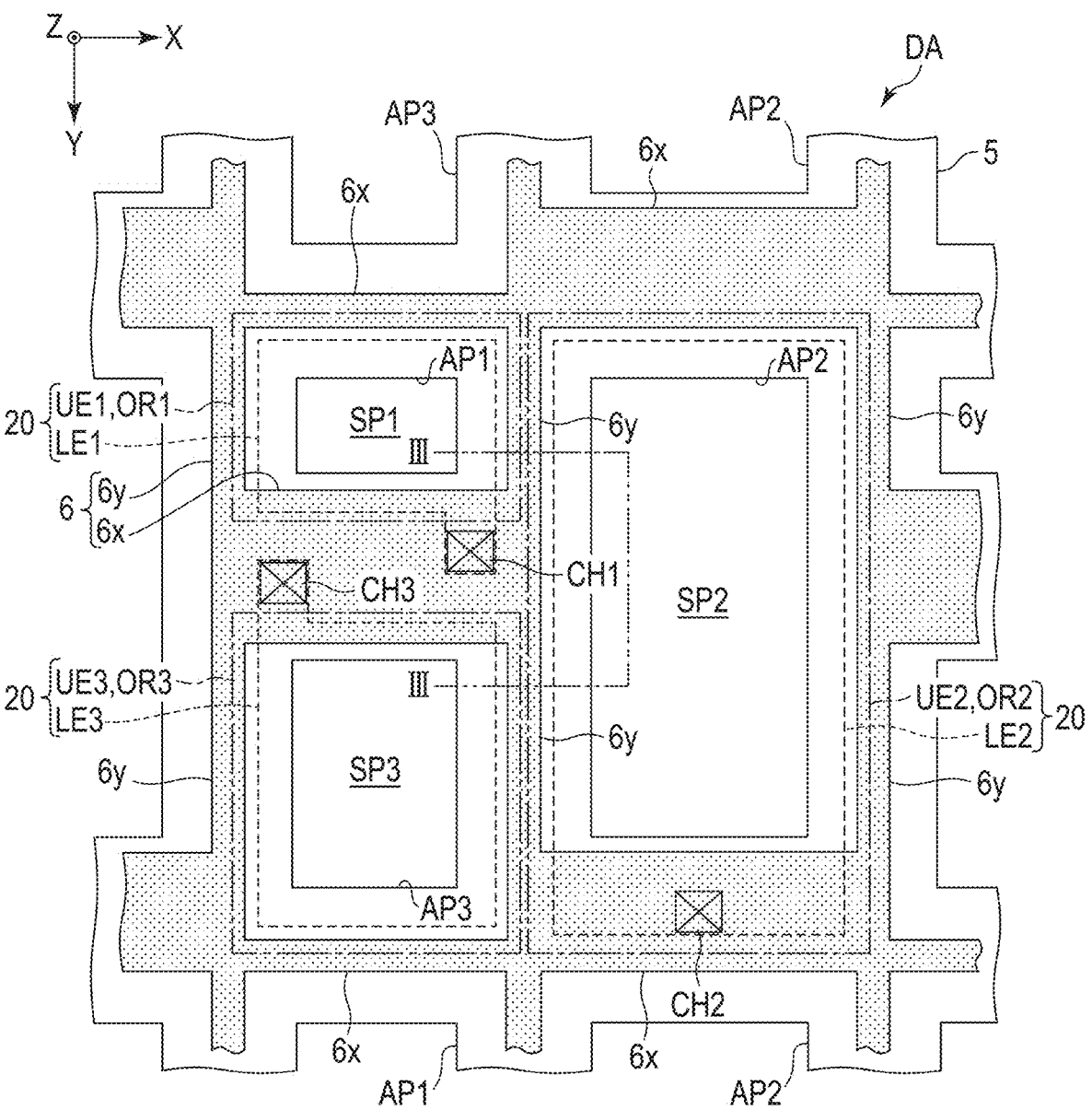
F I G. 2

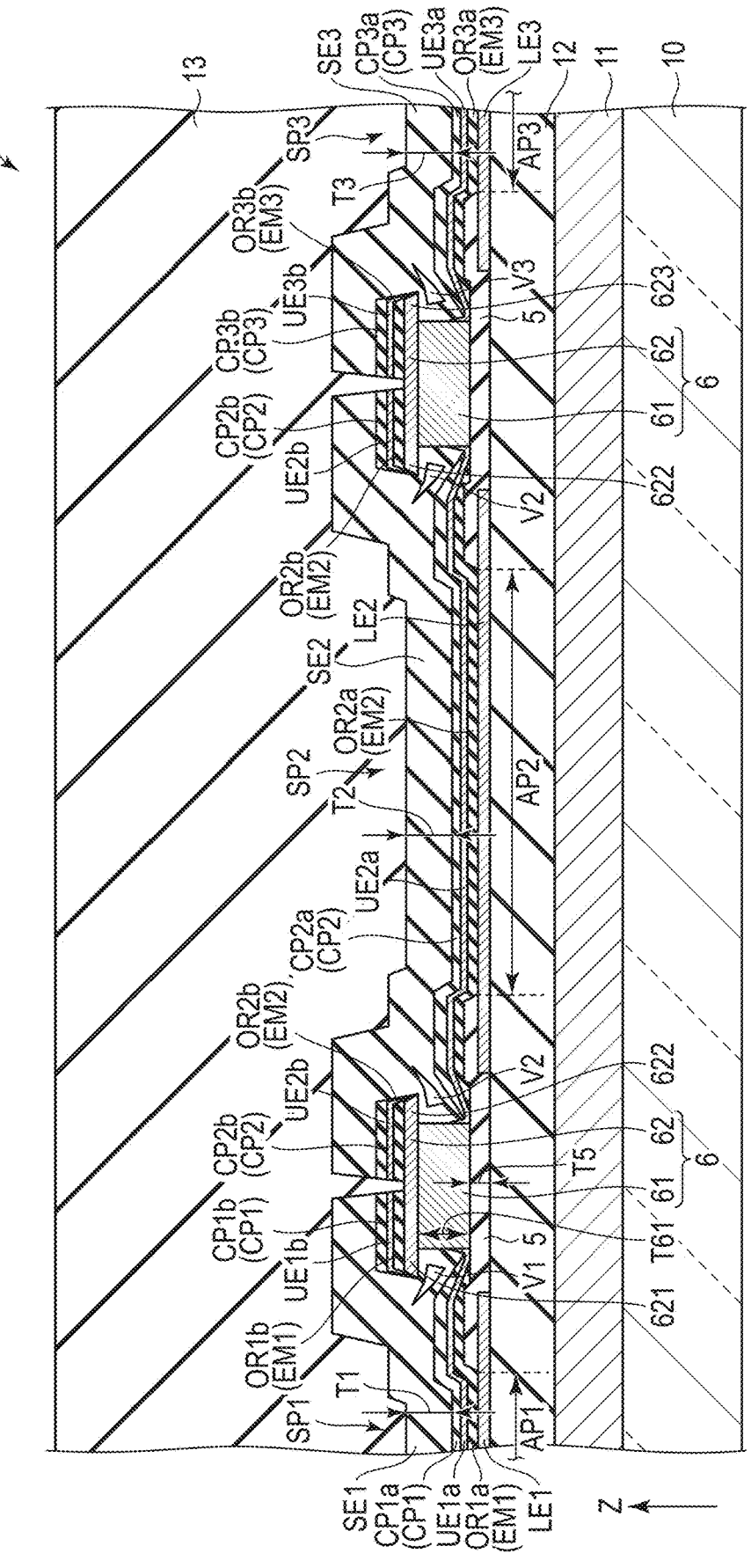
F I G. 3

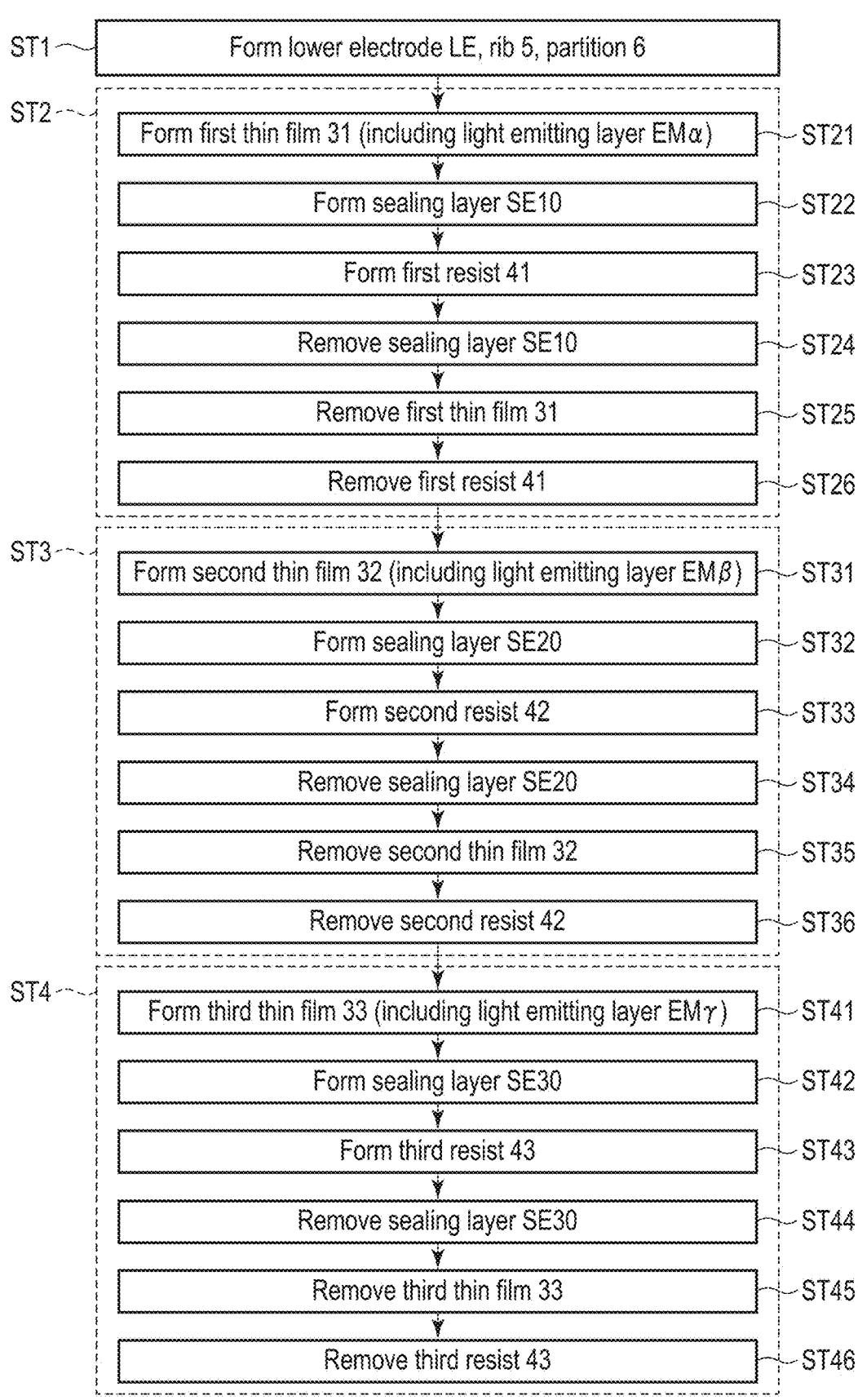

| | |
|---|---|
| ST1 | Form lower electrode LE, rib 5, partition 6 |
| ST2 | |
| ST21 | Form first thin film 31 (including light emitting layer EMα) |
| ST22 | Form sealing layer SE10 |
| ST23 | Form first resist 41 |
| ST24 | Remove sealing layer SE10 |
| ST25 | Remove first thin film 31 |
| ST26 | Remove first resist 41 |
| ST3 | |
| ST31 | Form second thin film 32 (including light emitting layer EMβ) |
| ST32 | Form sealing layer SE20 |
| ST33 | Form second resist 42 |
| ST34 | Remove sealing layer SE20 |
| ST35 | Remove second thin film 32 |
| ST36 | Remove second resist 42 |
| ST4 | |
| ST41 | Form third thin film 33 (including light emitting layer EMγ) |
| ST42 | Form sealing layer SE30 |
| ST43 | Form third resist 43 |
| ST44 | Remove sealing layer SE30 |
| ST45 | Remove third thin film 33 |
| ST46 | Remove third resist 43 |

F I G. 5

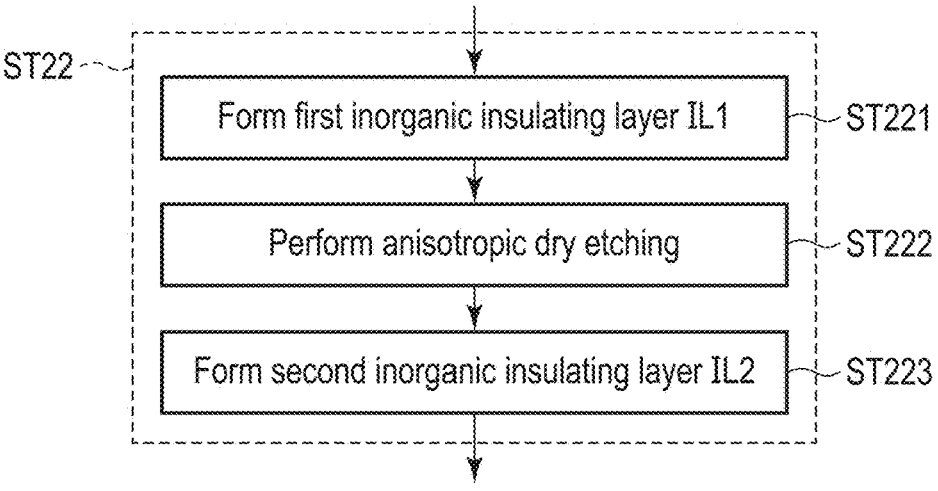
F I G. 6
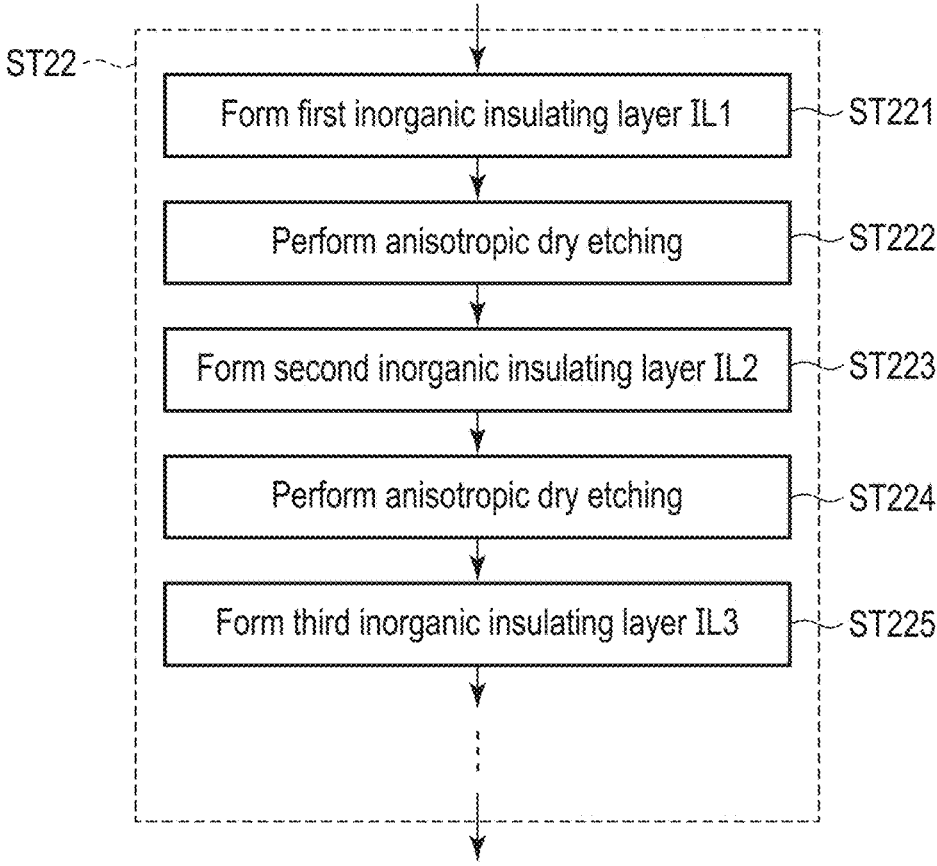
F I G. 7

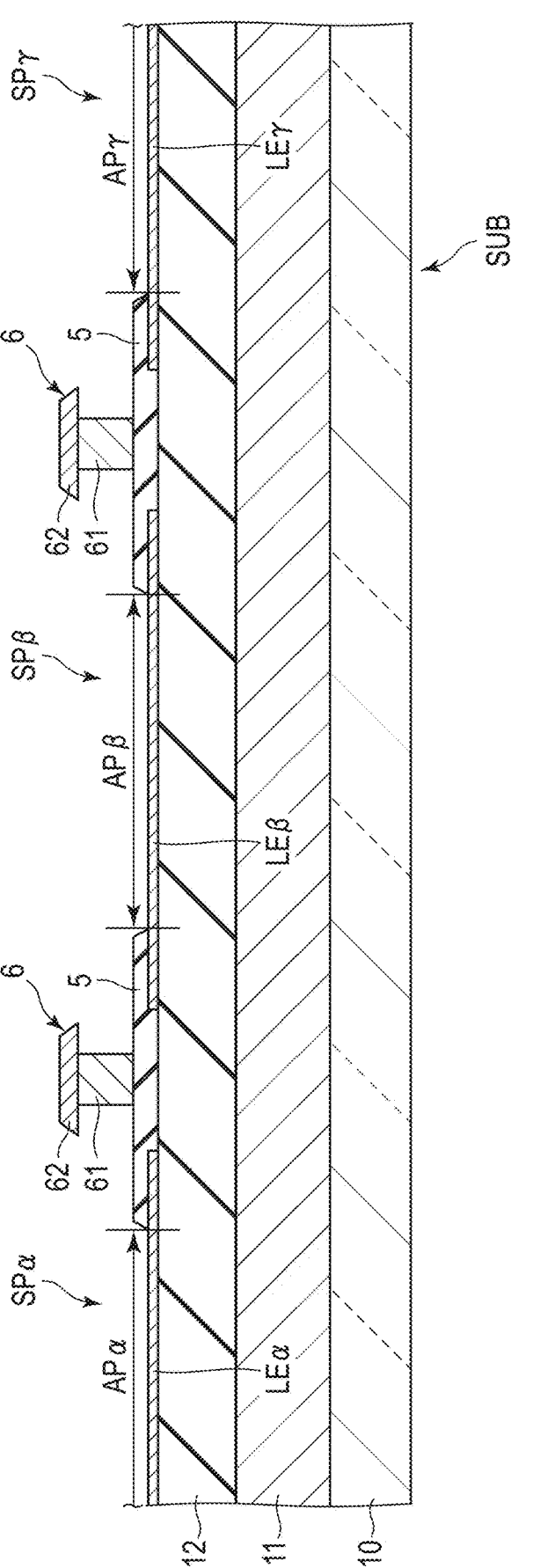
F I G. 8

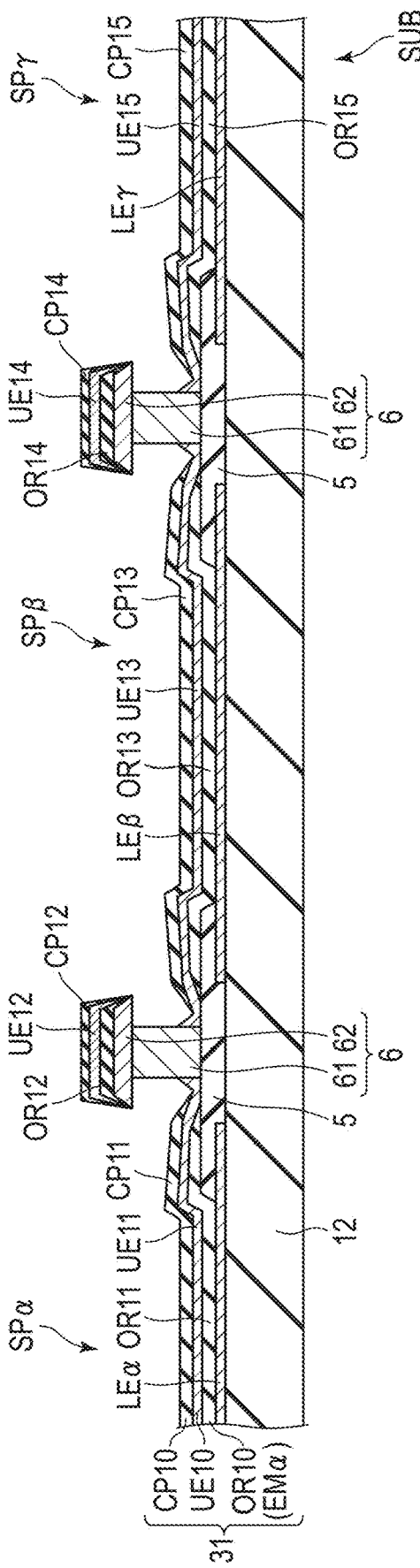
F I G. 9

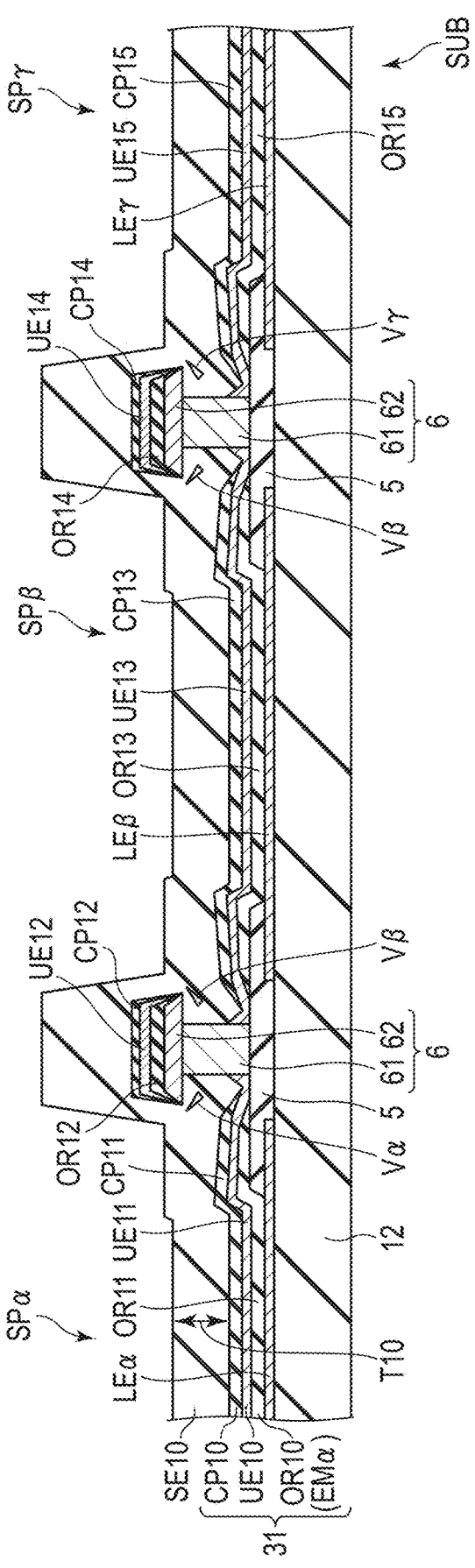
F I G. 10

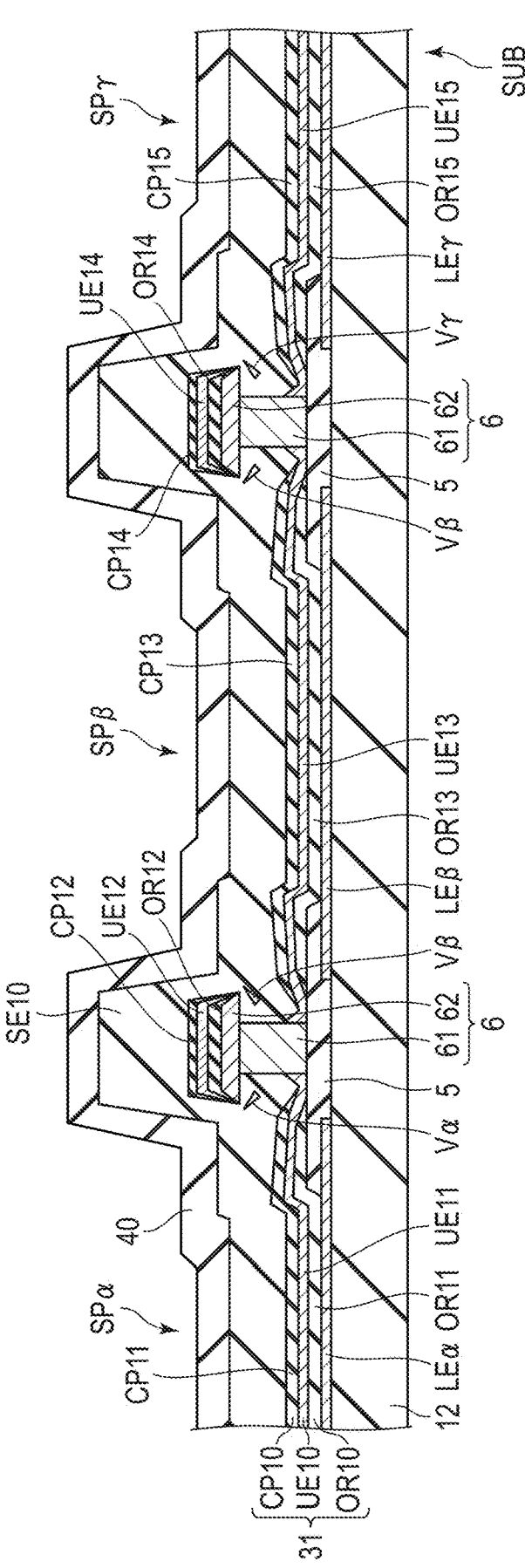
F I G. 14

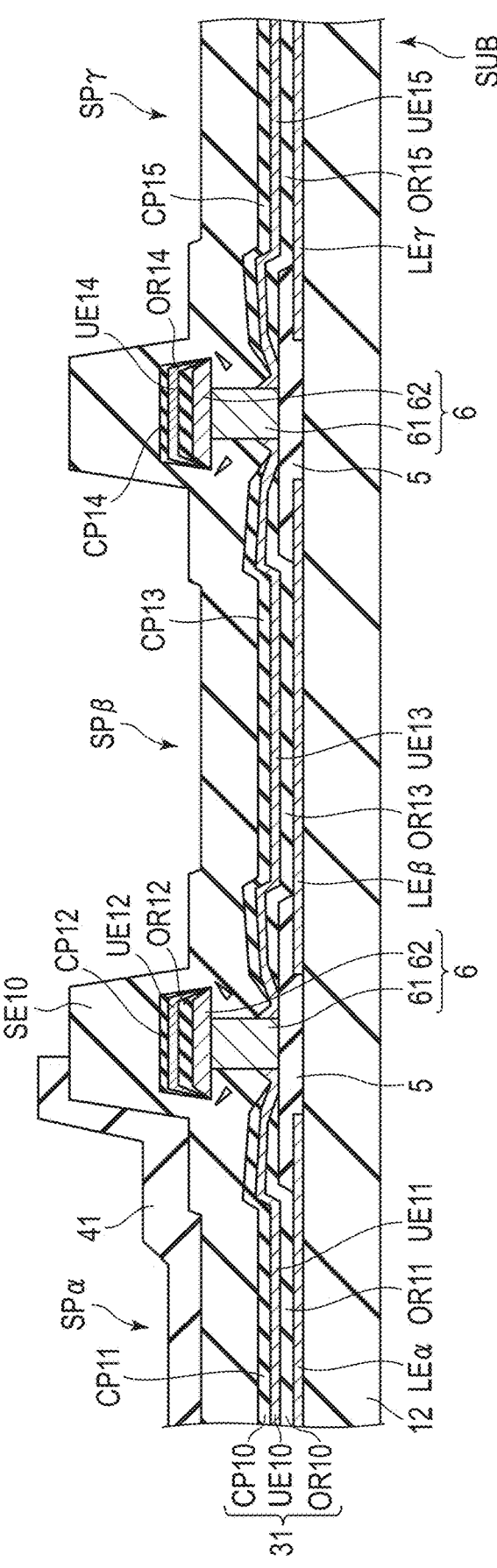
F I G. 15

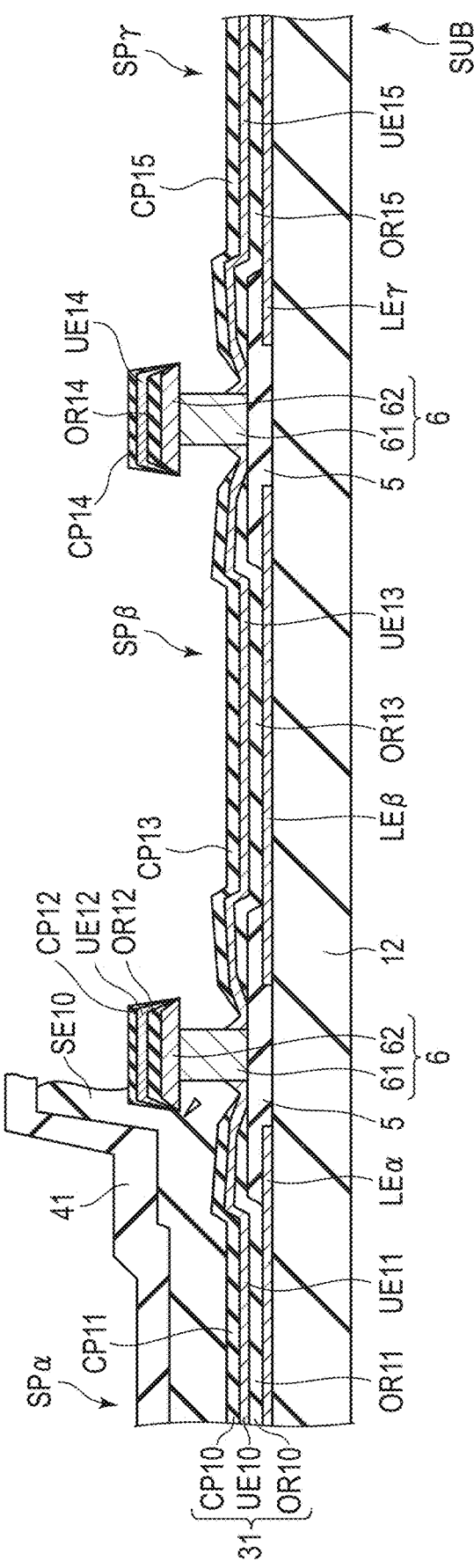
F I G. 16

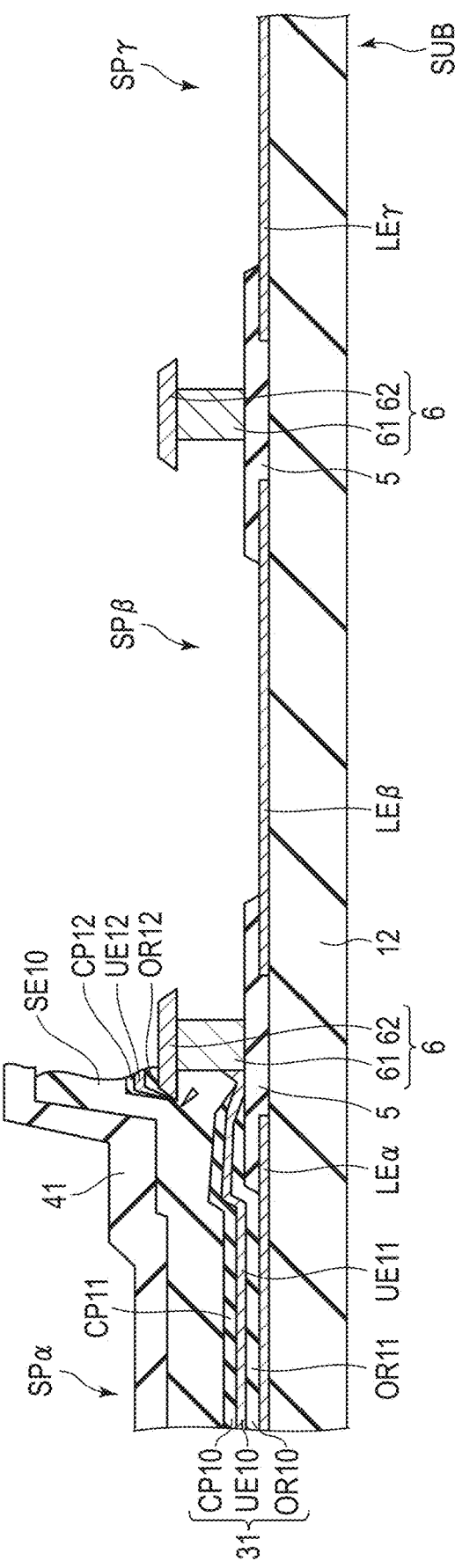
F I G. 17

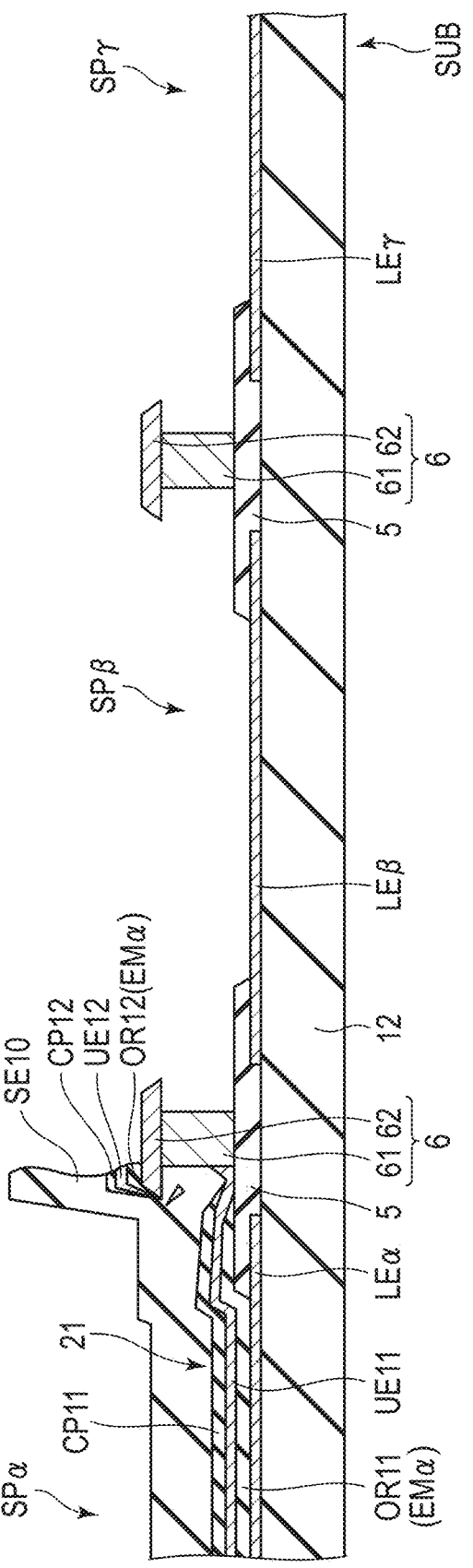
F I G. 18

DISPLAY DEVICE AND METHOD FOR MANUFACTURING DISPLAY DEVICE

CROSS-REFERENCE TO RELATED APPLICATIONS

This application is based upon and claims the benefit of priority from Japanese Patent Application No. 2022-030945 filed Mar. 1, 2022, the entire contents of which are incorporated herein by reference.

FIELD

Embodiments described herein relate generally to a display device and a method for manufacturing a display device.

BACKGROUND

Recently, display devices using organic light-emitting diodes (OLEDs) as display elements have been put to practical use. This display device comprises a pixel circuit including a thin-film transistor, a lower electrode connected to the pixel circuit, an organic layer covering the lower electrode, and an upper electrode covering the organic layer. The organic layer includes functional layers such as a hole-transport layer and an electron-transport layer, in addition to a light-emitting layer.

In the process of manufacturing such display devices, there is a need for a technology to suppress the degradation of reliability.

BRIEF DESCRIPTION OF THE DRAWINGS

FIG. 1 shows a configuration example of a display device DSP.

FIG. 2 shows an example of a layout of sub-pixels SP1, SP2, and SP3.

FIG. 3 is a schematic cross-sectional view of the display device DSP along a line III-III in FIG. 2.

FIG. 5 is a flow diagram illustrating an example of a manufacturing method of the display device DSP.

FIG. 6 illustrates an example of a process of forming a sealing layer SE10.

FIG. 7 illustrates another example of the process of forming the sealing layer SE10.

FIG. 8 illustrates step ST1.

FIG. 9 illustrates step ST21.

FIG. 10 illustrates step ST22.

FIG. 14 illustrates step ST23.

FIG. 15 illustrates step ST23.

FIG. 16 illustrates step ST24.

FIG. 17 illustrates step ST25.

FIG. 18 illustrates step ST26.

DETAILED DESCRIPTION

Figure 4:
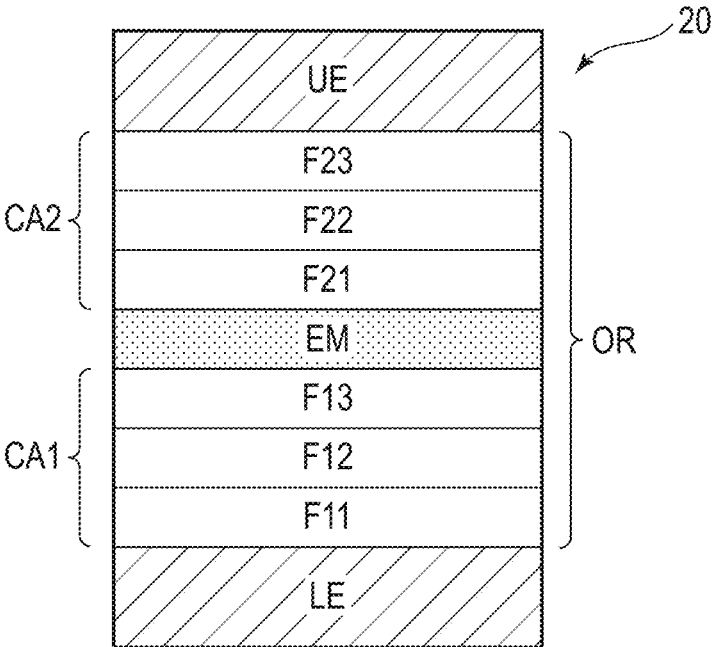
FIG. 4 shows an example of a configuration of a display element 20.

In general, according to one embodiment, a display device comprises: a substrate; a first lower electrode and a second lower electrode disposed above the substrate; a rib including a first aperture overlapping the first lower electrode and a second aperture overlapping the second lower electrode; a partition including a lower portion disposed on the rib between the first aperture and the second aperture and an upper portion disposed on the lower portion and projecting from a side surface of the lower portion; a first organic layer disposed on the first lower electrode in the first aperture and including a first light emitting layer; a second organic layer disposed on the second lower electrode in the second aperture and including a second light emitting layer formed of a different material from the first light emitting layer; a first upper electrode disposed on the first organic layer and in contact with the lower portion of the partition; a second upper electrode disposed on the second organic layer and in contact with the lower portion of the partition; a first sealing layer disposed above the first upper electrode and in contact with the lower portion of the partition; and a second sealing layer disposed above the second upper electrode, in contact with the lower portion of the partition, and separated from the first sealing layer, wherein a thickness of the first sealing layer directly above the first lower electrode is 0.5 times or more, and less than twice a thickness of the lower portion of the partition.

According to another embodiment, a method for manufacturing a display device, comprises processes of: preparing a processing substrate on which a lower electrode, a rib including an aperture overlapping the lower electrode, and a partition including a lower portion disposed on the rib and an upper portion disposed on the lower portion and protruding from a side surface of the lower portion are formed above a substrate; forming a thin film including an organic layer, an upper electrode, and a cap layer on the processing substrate; forming a sealing layer covering the thin film and the partition; forming a resist covering a part of the sealing layer; removing the sealing layer exposed from the resist by performing dry etching using the resist as a mask; and removing the thin film exposed from the resist and the sealing layer, wherein the process of forming the sealing layer comprises: forming a first inorganic insulating layer in contact with the thin film and the partition; performing anisotropic dry etching of the first inorganic insulating layer to reduce film thickness of the first inorganic insulating layer located directly above the lower electrode and directly above the upper portion of the partition; and forming a second inorganic insulating layer on the first inorganic insulating layer.

Embodiments will be described hereinafter with reference to the accompanying drawings.

The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

Note that, in order to make the descriptions more easily understandable, some of the drawings illustrate an X axis, a Y axis and a Z axis orthogonal to each other. A direction along the X axis is referred to as a first direction, a direction along the Y axis is referred to as a second direction and a direction along the Z axis is referred to as a third direction. Viewing structural element in an X-Y plane defined by the first direction X and the second direction Y is referred to as plan view.

The display device according to the present embodiment is an organic electroluminescent display device comprising an organic light-emitting diode (OLED) as a display element, and can be installed in TVs, personal computers, in-vehicle equipment, tablet terminals, smartphones, cell phone terminals, etc.

FIG. 1 shows a configuration example of a display device DSP.

The display device DSP includes a display area DA on which images are displayed and a peripheral area SA around the display area DA on an insulating substrate 10. The substrate 10 may be glass or a flexible resin film.

In the present embodiment, the shape of the substrate 10 in plan view is rectangular. However, the shape of the substrate 10 in plan view is not limited to a rectangle, but may be other shapes such as a square, circle or oval.

The display area DA comprises a plurality of pixels PX arranged in a matrix in a first direction X and a second direction Y. The pixel PX includes a plurality of sub-pixels SP. In one example, the pixel PX includes a red sub-pixel SP1, a blue sub-pixel SP2, and a green sub-pixel SP3. Note that the pixel PX may include sub-pixels SP of other colors such as white together with sub-pixels SP1, SP2, and SP3, or in place of any of the sub-pixels SP1, SP2, and SP3.

The sub-pixel SP comprises a pixel circuit 1 and a display element 20 driven by the pixel circuit 1. The pixel circuit 1 comprises a pixel switch 2, a drive transistor 3, and a capacitor 4. The pixel switch 2 and the drive transistor 3 are switching elements configured by thin-film transistors, for example.

A gate electrode of the pixel switch 2 is connected to a scanning line GL. One of a source electrode and a drain electrode of the pixel switch 2 is connected to a signal line SL, and the other is connected to a gate electrode of the drive transistor 3 and the capacitor 4. In the drive transistor 3, one of a source electrode and a drain electrode is connected to a power line PL and the capacitor 4, and the other is connected to an anode of the display element 20.

Note that the configuration of the pixel circuit 1 is not limited to the example shown in the drawing. For example, the pixel circuit 1 may comprise more thin-film transistors and capacitors.

The display element 20 is an organic light-emitting diode (OLED) as a light-emitting element, which may be referred to as an organic EL device. For example, the sub-pixel SP1 comprises a display element 20 emitting light in a red wavelength range, the sub-pixel SP2 comprises a display element 20 emitting light in a blue wavelength range, and the sub-pixel SP3 comprises a display element 20 emitting light in a green wavelength range.

FIG. 2 shows an example of a layout of the sub-pixels SP1, SP2, and SP3.

In the example of FIG. 2, the sub-pixels SP1 and SP3 are arranged in the second direction Y. Furthermore, the sub-pixels SP1 and SP3 are respectively arranged with the sub-pixel SP2 in the first direction X.

In a case where the sub-pixels SP1, SP2, and SP3 have such a layout, a column in which the sub-pixels SP1 and SP3 are arranged alternately in the second direction Y and a column in which a plurality of sub-pixels SP2 are arranged in the second direction Y are formed in the display area DA. These columns are arranged alternately in the first direction X.

Note that the layout of the sub-pixels SP1, SP2, and SP3 is not limited to the example of FIG. 2. As another example, the sub-pixels SP1, SP2, and SP3 in each pixel PX may be arranged in order in the first direction X.

A rib 5 and a partition 6 are arranged in the display area DA. The rib 5 includes apertures AP1, AP2, and AP3 in the sub-pixels SP1, SP2, and SP3, respectively. In the example of FIG. 2, the aperture AP3 is larger than the aperture AP1, and the aperture AP2 is larger than the aperture AP3.

The partition 6 overlaps the rib 5 in plan view. The partition 6 includes a plurality of first partitions 6x extending in the first direction X and a plurality of second partitions 6y extending in the second direction Y. The plurality of first partitions 6x are disposed between apertures AP1 and AP3 adjacent in the second direction Y and between two apertures AP2 adjacent in the second direction Y, respectively. The second partition 6y is disposed between apertures AP1 and AP2 adjacent in the first direction X and between apertures AP2 and AP3 adjacent in the first direction X, respectively.

In the example of FIG. 2, the first partition 6x and the second partition 6y are connected to each other. As a result, the partition 6 is formed as a whole in a lattice shape surrounding the apertures AP1, AP2, and AP3. The partition 6 can also be considered as having apertures in the sub-pixels SP1, SP2, and SP3 in the same manner as in the rib 5.

The sub-pixel SP1 comprises a lower electrode LE1, an upper electrode UE1, and an organic layer OR1, which overlap the aperture AP1, respectively. The sub-pixel SP2 comprises a lower electrode LE2, an upper electrode UE2, and an organic layer OR2, which overlap aperture AP2, respectively. The sub-pixel SP3 comprises a lower electrode LE3, an upper electrode UE3, and an organic layer OR3, which overlap the aperture AP3, respectively.

In the example of FIG. 2, the outlines of the lower electrodes LE1, LE2, and LE3 are shown in dotted lines, and the outlines of the organic layers OR1, OR2, and OR3, and the upper electrodes UE1, UE2, and UE3 are shown in single-dotted lines. The peripheral portion of each of the lower electrodes LE1, LE2, and LE3 overlap the rib 5. The outline of the upper electrode UE1 substantially matches the outline of the organic layer OR1, and each of the peripheral portions of the upper electrode UE1 and the organic layer OR1 overlaps the partition 6. The outline of the upper electrode UE2 substantially matches the outline of the organic layer OR2, and each of the peripheral portions of the upper electrode UE2 and the organic layer OR2 overlaps the partition 6. The outline of the upper electrode UE3 substantially matches the outline of the organic layer OR3, and each of the peripheral portions of the upper electrode UE3 and the organic layer OR3 overlaps the partition 6.

The lower electrode LE1, the upper electrode UE1, and the organic layer OR1 configure the display element 20 of the sub-pixel SP1. The lower electrode LE2, the upper electrode UE2, and the organic layer OR2 configure the display element 20 of the sub-pixel SP2. The lower electrode LE3, the upper electrode UE3, and the organic layer OR3 configure the display element 20 of the sub-pixel SP3. The lower electrodes LE1, LE2, and LE3 correspond to the anodes of the display element 20, for example. The upper electrodes UE1, UE2, and UE3 correspond to the cathodes or common electrodes of the display element 20.

The lower electrode LE1 is connected to the pixel circuit 1 of the sub-pixel SP1 (see FIG. 1) through a contact hole CH1. The lower electrode LE2 is connected to the pixel circuit 1 of the sub-pixel SP2 through a contact hole CH2. The lower electrode LE3 is connected to the pixel circuit 1 of the sub-pixel SP3 through a contact hole CH3.

FIG. 3 is a schematic cross-sectional view of the display device DSP along line III-III in FIG. 2.

A circuit layer 11 is disposed on the substrate 10 described above. The circuit layer 11 includes various circuits such as the pixel circuit 1, and various lines such as the scanning line GL, the signal line SL, and the power line PL shown in FIG. 1. The circuit layer 11 is covered by an insulating layer 12. The insulating layer 12 functions as a planarization film that planarizes an unevenness caused by the circuit layer 11.

The lower electrodes LE1, LE2, LE3 are disposed on the insulating layer 12. The rib 5 is disposed on the insulating layer 12 and the lower electrodes LE1, LE2, and LE3. The end portions of the lower electrodes LE1, LE2, and LE3 are covered by the rib 5. In other words, the end portions of the lower electrodes LE1, LE2, and LE3 are located between the insulating layer 12 and the rib 5. Between the lower electrodes LE1, LE2, and LE3, which are adjacent to each other, the insulating layer 12 is covered by the rib 5.

The partition 6 includes a lower portion (stem) 61 disposed on the rib 5 and an upper portion (shade) 62 disposed on the lower portion 61. The lower portion 61 of the partition 6 shown on the left side of the drawing is located between the apertures AP1 and AP2. The lower portion 61 of the partition 6 shown on the right side of the drawing is located between the apertures AP2 and AP3. The upper portion 62 has a greater width than the lower portion 61. As a result, both end portions of the upper portion 62 protrude from the side surfaces of the lower portion 61 in FIG. 3. This shape of the partition 6 can also be referred to as an overhang shape. The portion of the upper portion 62 that protrudes more than the lower portion 61 may simply be referred to as the protruding portion.

The organic layer OR1 shown in FIG. 2 includes a first portion OR1a and a second portion OR1b separated from each other as shown in FIG. 3. The first portion OR1a is in contact with the lower electrode LE1 through the aperture AP1, covers the lower electrode LE1, and overlaps a part of the rib 5. The second portion OR1b is disposed on the upper portion 62.

The upper electrode UE1 shown in FIG. 2 includes a first portion UE1a and a second portion UE1b separated from each other as shown in FIG. 3. The first portion UE1a faces the lower electrode LE1 and is disposed on the first portion OR1a. Furthermore, the first portion UE1a is in contact with the side surface of the lower portion 61. The second portion UE1b is located above the partition 6 and is disposed on the second portion OR1b.

The first portion OR1a and the first portion UE1a are located below the upper portion 62.

The organic layer OR2 shown in FIG. 2 includes a first portion OR2a and a second portion OR2b separated from each other as shown in FIG. 3. The first portion OR2a is in contact with the lower electrode LE2 through the aperture AP2, covers the lower electrode LE2, and overlaps a part of the rib 5. The second portion OR2b is disposed on the upper portion 62.

The upper electrode UE2 shown in FIG. 2 includes a first portion UE2a and a second portion UE2b separated from each other as shown in FIG. 3. The first portion UE2a faces the lower electrode LE2 and is disposed on the first portion OR2a. Furthermore, the first portion UE2a is in contact with the side surface of the lower portion 61. The second portion UE2b is located above the partition 6 and is disposed on the second portion OR2b.

The first portion OR2a and the first portion UE2a are located below the upper portion 62.

The organic layer OR3 shown in FIG. 2 includes a first portion OR3a and a second portion OR3b separated from each other as shown in FIG. 3. The first portion OR3a is in contact with the lower electrode LE3 through the aperture AP3, covers the lower electrode LE3, and overlaps a part of the rib 5. The second portion OR3b is disposed on the upper portion 62.

The upper electrode UE3 shown in FIG. 2 includes a first portion UE3a and a second portion UE3b separated from each other as shown in FIG. 3. The first portion UE3a faces the lower electrode LE3 and is disposed on the first portion OR3a. Furthermore, the first portion UE3a is in contact with the side surface of the lower portion 61. The second portion UE3b is located on the partition 6 and is disposed on the second portion OR3b.

The first portion OR3a and the first portion UE3a are located below the upper portion 62.

In the example shown in FIG. 3, the sub-pixels SP1, SP2, and SP3 include cap layers (optical adjustment layers) CP1, CP2, and CP3 for adjusting the optical properties of light emitted by the light emitting layers of the organic layers OR1, OR2, and OR3.

The cap layer CP1 includes a first portion CP1a and a second portion CP1b separated from each other. The first portion CP1a is located at the aperture AP1, is located below the upper portion 62, and is disposed on the first portion UE1a. The second portion CP1b is located above the partition 6 and is disposed on the second portion UE1b.

The cap layer CP2 includes a first portion CP2a and a second portion CP2b separated from each other. The first portion CP2a is located at the aperture AP2, is located below the upper portion 62, and is disposed on the first portion UE2a. The second portion CP2b is located above the partition 6 and is disposed on the second portion UE2b.

The cap layer CP3 includes a first portion CP3a and a second portion CP3b separated from each other. The first portion CP3a is located at the aperture AP3, is located below the upper portion 62, and is disposed on the first portion UE3a. The second portion CP3b is located above the partition 6 and is disposed on the second portion UE3b.

Sealing layers SE1, SE2, and SE3 are disposed on the sub-pixels SP1, SP2, and SP3, respectively.

The sealing layer SE1 is in contact with the first portion CP1a, the lower portion 61 and the upper portion 62 of the partition 6, and the second portion CP1b, and continuously covers each member of the sub-pixel SP1. In the illustrated example, the sealing layer SE1 has a closed void V1 below the upper portion 62 of the partition 6 (below a protruding portion 621). The void V1 is separated from the partition 6. The void V1 is surrounded by portions of the sealing layer SE1 that are in contact with the side surface of the lower portion 61 of the partition 6, the bottom of the upper portion 62 of the partition 6, and the first portion CP1a. The void V1 is formed along the entire circumference of the partition 6 surrounding the aperture AP1, but may be partially missing. The void V1 is also closed over its entirety.

The sealing layer SE2 is in contact with the first portion CP2a, the lower portion 61 and the upper portion 62 of the partition 6, and the second portion CP2b, and continuously covers each member of the sub-pixel SP2. The sealing layer SE2 has a closed void V2 below the upper portion 62 of the partition 6 (below a protruding portion 622). The void V2 is located on the opposite side of the void V1 across the partition 6. The void V2 is formed along the entire circumference of the partition 6 surrounding the aperture AP2, but may be partially missing. The void V2 is also closed over its entirety.

The sealing layer SE3 is in contact with the first portion CP3a, the lower portion 61 and the upper portion 62 of the partition 6, and the second portion CP3b, and continuously covers each member of the sub-pixel SP3. The sealing layer SE3 has a closed void V3 below the upper portion 62 of the partition 6 (below a protruding portion 623). The void V3 is located on the opposite side of the void V2 across the partition 6. The void V3 is formed along the entire circumference of the partition 6 surrounding the aperture AP3, but may be partially missing. The void V3 is also closed over its entirety.

The sealing layers SE1, SE2, and SE3 are covered by a protective layer 13.

In the example of FIG. 3, on the partition 6 between the sub-pixels SP1 and SP2, the second portion OR1b of the organic layer OR1 is separated from the second portion OR2b of the organic layer OR2, the second portion UE1b of the upper electrode UE1 is separated from the second portion UE2b of the upper electrode UE2, the second portion CP1b of the cap layer CP1 is separated from the second portion CP2b of the cap layer CP2, and the sealing layer SE1 is separated from the sealing layer SE2. The protective layer 13 is disposed between the second portion OR1b and the second portion OR2b, between the second portion UE1b and the second portion UE2b, between the second portion CP1b and the second portion CP2b, and between the sealing layer SE1 and sealing layer SE2, respectively.

In addition, on the partition 6 between the sub-pixels SP2 and SP3, the second portion OR2b of the organic layer OR2 is separated from the second portion OR3b of the organic layer OR3, the second portion UE2b of the upper electrode UE2 is separated from the second portion UE3b of the upper electrode UE3, the second portion CP2b of the cap layer CP2 is separated from the second portion CP3b of the cap layer CP3, and the sealing layer SE2 is separated from the sealing layer SE3. The protective layer 13 is disposed between the second portion OR2b and the second portion OR3b, between the second portion UE2b and the second portion UE3b, between the second portion CP2b and the second portion CP3b, and between the sealing layer SE2 and the sealing layer SE3, respectively.

The insulating layer 12 is an organic insulating layer. The rib 5 and the sealing layers SE1, SE2, and SE3 are inorganic insulating layers.

The rib 5 and the sealing layers SE1, SE2, and SE3 are formed of the same inorganic insulating material, for example.

The rib 5 is formed, for example, of silicon nitride (SiNx). Note that the rib 5 may be formed as a single-layer body of either silicon oxide (SiOx), silicon oxynitride (SiON), or aluminum oxide ($Al_2O_3$). The rib 5 may also be formed as a stacked layer body of a combination of at least two of a silicon nitride layer, a silicon oxide layer, a silicon oxynitride layer, and an aluminum oxide layer.

The sealing layers SE1, SE2, and SE3 are formed, for example, of silicon nitride (SiNx).

The lower portion 61 of the partition 6 is formed by a conductive material and is electrically connected to the first portions UE1a, UE2a, and UE3a of each upper electrode. Both the lower portion 61 and the upper portion 62 of the partition 6 may be conductive.

A thickness T5 of the rib 5 is sufficiently small compared to the thicknesses of the partition 6 and the insulating layer 12. In one example, the thickness T5 of the rib 5 is from 200 nm to 400 nm.

The sealing layer SE1 has a thickness T1 directly above the lower electrode LE1 overlapping the aperture AP1. The sealing layer SE2 has a thickness T2 directly above the lower electrode LE2 overlapping the aperture AP2. The sealing layer SE3 has a thickness T3 directly above the lower electrode LE3 overlapping the aperture AP3. The thicknesses T1, T2, and T3 are approximately equal and are equal to or greater than 0.5 μm and less than 2 μm.

A thickness T61 of the lower portion 61 of the partition 6 (thickness from the upper surface of the rib 5 to the lower surface of the upper portion 62) is greater than the thickness T5 of the rib 5. In addition, the thicknesses T1 to T3 are equal to or greater than 0.5 times and less than twice the thickness T61.

The lower electrodes LE1, LE2, and LE3 may be formed of a transparent conductive material such as ITO, or may have a stacked layer structure of a metallic material such as silver (Ag) and a transparent conductive material. The upper electrodes UE1, UE2, and UE3 are formed of a metallic material such as an alloy of magnesium and silver (MgAg). The upper electrodes UE1, UE2, and UE3 may be formed of a transparent conductive material such as ITO.

In a case where the potential of the lower electrodes LE1, LE2, and LE3 is relatively higher than that of the upper electrodes UE1, UE2, and UE3, the lower electrodes LE1, LE2, and LE3 correspond to anodes and the upper electrodes UE1, UE2, and UE3 correspond to cathodes. In addition, in a case where the potential of the upper electrodes UE1, UE2, and UE3 is relatively higher than that of the lower electrodes LE1, LE2, and LE3, the upper electrodes UE1, UE2, and UE3 correspond to the anodes and the lower electrodes LE1, LE2, and LE3 correspond to the cathodes.

The organic layers OR1, OR2, and OR3 include multiple functional layers. In addition, the first portion OR1a and the second portion OR1b of the organic layer OR1 include a light emitting layer EM1 formed of the same material. The first portion OR2a and the second portion OR2b of the organic layer OR2 include a light emitting layer EM2 formed of the same material. The emitting layer EM2 is formed of a different material from the light emitting layer EM1. The first portion OR3a and the second portion OR3b of the organic layer OR3 include a light emitting layer EM3 formed of the same material. The light emitting layer EM3 is formed of a different material from the light emitting layers EM1 and EM2. The material forming the light emitting layer EM1, the material forming the light emitting layer EM2, and the material forming the light emitting layer EM3 are materials that emit light in different wavelength ranges from each other.

The cap layers CP1, CP2, and CP3 are formed, for example, by multi-layered bodies of transparent thin films. The multi-layered body may include, as thin films, a thin film formed of an inorganic material and a thin film formed of an organic material. These plurality of thin films have different refractive indices from each other. The materials of the thin films configuring the multi-layered body are different from the materials of the upper electrodes UE1, UE2, and UE3, and also different from the materials of the sealing layers SE1, SE2, and SE3. Note that the cap layers CP1, CP2, and CP3 may be omitted.

The protective layer 13 is formed by a multi-layered body of transparent thin films and includes, for example, as thin films, a thin film formed of an inorganic material and a thin film formed of an organic material.

A common voltage is supplied to the partition 6. This common voltage is supplied to the first portions UE1a, UE2a, and UE3a of each of the upper electrodes, which are in contact with the side surface of the lower portion 61, respectively. The lower electrodes LE1, LE2, and LE3 are supplied with pixel voltages through the pixel circuits 1 of each of the sub-pixels SP1, SP2, and SP3.

When a potential difference is formed between the lower electrode LE1 and the upper electrode UE1, the light emitting layer EM1 of the first portion OR1a of the organic layer OR1 emits light in a red wavelength range. When a potential difference is formed between the lower electrode LE2 and the upper electrode UE2, the light emitting layer EM2 of the first portion OR2a of the organic layer OR2 emits light in a blue wavelength region. When a potential difference is formed between the lower electrode LE3 and the upper electrode UE3, the light emitting layer EM3 of the first portion OR3a of the organic layer OR3 emits light in a green wavelength range.

As another example, the light emitting layers of the organic layers OR1, OR2, and OR3 may emit light of the same color (e.g., white). In this case, the display device DSP may comprise color filters that convert the light emitted by the light emitting layers into light of colors corresponding to the sub-pixels SP1, SP2, and SP3. The display device DSP may comprise a layer containing quantum dots that are excited by the light emitted from the light emitting layers and generate light of colors corresponding to the sub-pixels SP1, SP2, and SP3.

In the examples shown in FIG. 1 to FIG. 3, the aperture AP1 corresponds to a first aperture, the aperture AP2 corresponds to a second aperture, the lower electrode LE1 corresponds to a first lower electrode, the organic layer OR1 corresponds to a first organic layer, the light emitting layer EM1 corresponds to a first light emitting layer, the upper electrode UE1 corresponds to a first upper electrode, the cap layer CP1 corresponds to a first cap layer, the sealing layer SE1 corresponds to a first sealing layer, the lower electrode LE2 corresponds to a second lower electrode, the organic layer OR2 corresponds to a second organic layer, the light emitting layer EM2 corresponds to a second light emitting layer, the upper electrode UE2 corresponds to a second upper electrode, the cap layer CP2 corresponds to a second cap layer, and the sealing layer SE2 corresponds to a second sealing layer.

FIG. 4 shows an example of a configuration of the display element 20.

The lower electrode LE shown in FIG. 4 corresponds to each of the lower electrodes LE1, LE2, and LE3 in FIG. 3. The organic layer OR shown in FIG. 4 corresponds to each of the organic layers OR1, OR2, and OR3 in FIG. 3. The upper electrode UE shown in FIG. 4 corresponds to each of the upper electrodes UE1, UE2, and UE3 in FIG. 3.

The organic layer OR includes a carrier adjustment layer CA1, a light emitting layer EM, and a carrier adjustment layer CA2. The carrier adjustment layer CA1 is located between the lower electrode LE and the light emitting layer EM, and the carrier adjustment layer CA2 is located between the light emitting layer EM and the upper electrode UE. The carrier adjustment layers CA1 and CA2 include a plurality of functional layers. In the following, an example of a case in which the lower electrode LE corresponds to the anode and the upper electrode UE corresponds to the cathode is described.

The carrier adjustment layer CA1 includes a hole-injection layer F11, a hole-transport layer F12, and an electron blocking layer F13, and the like, as functional layers. The hole-injection layer F11 is disposed on the lower electrode LE, the hole-transport layer F12 is disposed on the hole-injection layer F11, the electron blocking layer F13 is disposed on the hole-transport layer F12, and the light emitting layer EM is disposed on the electron blocking layer F13.

The carrier adjustment layer CA2 includes a hole blocking layer F21, an electron-transport layer F22, and an electron-injection layer F23, and the like, as functional layers. The hole blocking layer F21 is disposed on the light emitting layer EM, the electron-transport layer F22 is disposed on the hole blocking layer F21, the electron-injection layer F23 is disposed on the electron-transport layer F22, and the upper electrode UE is disposed on the electron-injection layer F23.

Note that, in addition to the functional layers described above, the carrier adjustment layers CA1 and CA2 may include other functional layers such as a carrier generation layer if necessary, or at least one of the functional layers described above may be omitted.

Next, an example of a manufacturing method of the display device DSP will be described.

FIG. 5 is a flow diagram for explaining an example of a manufacturing method of the display device DSP.

The manufacturing method shown here can be roughly divided into a process for preparing a processing substrate SUB that serves as a base for sub-pixels SPα, SPβ, and SPγ (step ST1), a process for forming the sub-pixel SPα (step ST2), a process for forming the sub-pixel SPβ (step ST3), and a process for forming the sub-pixel SPγ (step ST4). Note that the sub-pixels SPα, SPβ, and SPγ here are one of the above sub-pixels SP1, SP2, and SP3.

In step ST1, first, a processing substrate SUB having lower electrodes LEα, LEβ, and LEγ, the rib 5, and the partition 6 formed on the substrate 10 is prepared. As shown in FIG. 3, the circuit layer 11 and the insulating layer 12 are also formed between the substrate 10 and the lower electrodes LEα, LEβ, and LEγ.

In step ST2, first, a first thin film 31 including a light emitting layer EMα is formed on the processing substrate SUB (step ST21). Then, a sealing layer SE10 covering the first thin film 31 and the partition 6 is formed (step ST22). Then, a first resist 41 patterned in a predetermined shape is formed on the sealing layer SE10 (step ST23). Then, a part of the sealing layer SE10 is removed by etching using the first resist 41 as a mask (step ST24). Then, a part of the first thin film 31 is removed by etching using the first resist 41 as a mask (step ST25). Then, the first resist 41 is removed (step ST26). As a result, the sub-pixel SPα is formed. The sub-pixel SPα comprises a display element 21 including the first thin film 31 of a predetermined shape. The display element 21 is sealed with the sealing layer SE10.

In step ST3, first, a second thin film 32 including a light emitting layer EM is formed on the processing substrate SUB (step ST31). Then, a sealing layer SE20 covering the second thin film 32 and the partition 6 is formed (step ST32). Then, a second resist 42 patterned in a predetermined shape is formed on the sealing layer SE20 (step ST33). Then, a part of the sealing layer SE20 is removed by etching using the second resist 42 as a mask (step ST34). Then, a part of the second thin film 32 is removed by etching using the second resist 42 as a mask (step ST35). Then the second resist 42 is removed (step ST36). As a result, the sub-pixel SPβ is formed. The sub-pixel SPβ comprises a display element 22 including the second thin film 32 of a predetermined shape. The display element 22 is sealed with the sealing layer SE20.

In step ST4, first, a third thin film 33 including a light emitting layer EMγ is formed on the processing substrate SUB (step ST41). Then, a sealing layer SE30 covering the third thin film 33 and the partition 6 is formed (step ST42). Then, a third resist 43 patterned in a predetermined shape is formed on the sealing layer SE30 (step ST43). Then, a part of the sealing layer SE30 is removed by etching using the third resist 43 as a mask (step ST44). Then, a part of the third thin film 33 is removed by etching using the third resist 43 as a mask (step ST45). Then the third resist 43 is removed (step ST46). As a result, the sub-pixel SPγ is formed. The sub-pixel SPγ comprises a display element 23 including the third thin film 33 of a predetermined shape. The display element 23 is sealed with the sealing layer SE30.

The light emitting layer EMα, the light emitting layer EM, and the light emitting layer EMγ are formed by materials emitting light in different wavelength ranges from each other.

Note that detailed illustrations of the second thin film 32, the light emitting layer EM, the display element 22, the sealing layer SE20, the third thin film 33, the light emitting layer EMγ, the display element 23, and the sealing layer SE30 are omitted.

Here, the process of forming the sealing layer SE10 in step ST22 will now be described more specifically.

FIG. 6 illustrates an example of the process of forming the sealing layer SE10.

First, a first inorganic insulating layer IL1, which is in contact with the first thin film 31 and the partition 6, is formed (step ST221). Then, anisotropic dry etching of the first inorganic insulating layer IL1 is performed to reduce the film thickness of the first inorganic insulating layer IL1 (step ST222). At this time, the film thickness of the first inorganic insulating layer IL1 is greater than 0 μm. In other words, no through holes are formed in the first inorganic insulating layer IL'. Then, a second inorganic insulating layer IL2 is formed on the first inorganic insulating layer IL1 (step ST223).

Thereby, the sealing layer SE10 is formed. In other words, in the example shown in FIG. 6, the sealing layer SE10 is formed as a stacked layer body of the first inorganic insulating layer IL1 and the second inorganic insulating layer IL2.

FIG. 7 illustrates another example of the process of forming the sealing layer SE10.

First, the first inorganic insulating layer IL1 in contact with the first thin film 31 and the partition 6 is formed (step ST221). Then, anisotropic dry etching of the first inorganic insulating layer IL1 is performed to reduce the film thickness of the first inorganic insulating layer IL1 (step ST222). At this time, the film thickness of the first inorganic insulating layer IL1 is greater than 0 μm. Then, the second inorganic insulating layer IL2 is formed on the first inorganic insulating layer IL1 (step ST223). Then, anisotropic dry etching of the second inorganic insulating layer IL2 is performed to reduce the film thickness of the second inorganic insulating layer IL2 (step ST224). At this time, the film thickness of the second inorganic insulating layer IL2 is greater than 0 μm. In other words, no through holes are formed in the second inorganic insulating layer IL2. Then, a third inorganic insulating layer IL3 is formed on the second inorganic insulating layer IL2 (step ST225).

Thereby, the sealing layer SE10 is formed. In other words, in the example shown in FIG. 7, the sealing layer SE10 is formed as a stacked layer body of the first inorganic insulating layer IL', the second inorganic insulating layer IL2, and the third inorganic insulating layer IL3.

Note that, in the example shown in FIG. 7, after forming the third inorganic insulating layer IL3, the process of performing the anisotropic dry etching and the process of forming the inorganic insulating layer may be repeated. In this case, the sealing layer SE10 is formed as a stacked layer body of four or more inorganic insulating layers.

In FIG. 6 and FIG. 7, the process of forming the sealing layer SE10 in step ST22 is described, but the process of FIG. 6 or FIG. 7 can also be applied to the process of forming the sealing layer SE20 in step ST32 and the process of forming the sealing layer SE30 in step ST42, respectively.

In the following, step ST1 and step ST2 will be described with reference to FIG. 8 to FIG. 18.

First, in step ST1, the processing substrate SUB is prepared as shown in FIG. 8. The process of preparing the processing substrate SUB includes a process of forming the circuit layer 11 on the substrate 10, a process of forming the insulating layer 12 on the circuit layer 11, a process of forming, on the insulating layer 12, the lower electrode LEα of the sub-pixel SPα, the lower electrode LEβ of the sub-pixel SPβ, and the lower electrode LEγ of the sub-pixel SPγ, a process of forming the rib 5 having the apertures APα, APβ, and APγ that overlap each of the lower electrodes LEα, LEβ, and LEγ, and a process of forming the partition 6 including the lower portion 61 disposed on the rib 5 and the upper portion 62 disposed on the lower portion 61 and protruding from the side surface of the lower portion 61. Note that, in FIG. 9 to FIG. 18, the substrate 10 and the circuit layer 11, which are in lower layers than the insulating layer 12, are omitted.

Subsequently, in step ST21, the first thin film 31 is formed over the sub-pixel SPα, the sub-pixel SPβ, and the sub-pixel SPγ, as shown in FIG. 9. The process of forming the first thin film 31 includes processes of forming, on the processing substrate SUB, an organic layer OR10 including the light emitting layer EMα, an upper electrode UE10 on the organic layer OR10, and a cap layer CP10 on the upper electrode UE10. In other words, in the illustrated example, the first thin film 31 includes the organic layer OR10, the upper electrode UE10, and the cap layer CP10.

The organic layer OR10 includes an organic layer OR11, an organic layer OR12, an organic layer OR13, an organic layer OR14, and an organic layer OR15. The organic layer OR11, the organic layer OR12, the organic layer OR13, the organic layer OR14, and the organic layer OR15 all include the light emitting layer EMα.

The organic layer OR11 is formed in a manner covering the lower electrode LEα. The organic layer OR12 is separated from the organic layer OR11 and is located on the upper portion 62 of the partition 6 between the lower electrode LEα and the lower electrode LEβ. The organic layer OR13 is separated from the organic layer OR12 and is formed in a manner covering the lower electrode LEβ. The organic layer OR14 is separated from the organic layer OR13 and is located on the upper portion 62 of the partition 6 between the lower electrode LEβ and the lower electrode LEγ. The organic layer OR15 is separated from the organic layer OR14 and covers the lower electrode LEγ.

The upper electrode UE10 includes an upper electrode UE11, an upper electrode UE12, an upper electrode UE13, an upper electrode UE14, and an upper electrode UE15.

The upper electrode UE11 is located on the organic layer OR11 and is in contact with the lower portion 61 of the partition 6 between the lower electrode LEα and the lower electrode LEβ. The upper electrode UE12 is separated from the upper electrode UE11 and is located on the organic layer OR12 between the lower electrode LEα and the lower electrode LEβ. The upper electrode UE13 is separated from the upper electrode UE12 and is located on the organic layer OR13. In the illustrated example, the upper electrode UE13 is in contact with the lower portion 61 of the partition 6 between the lower electrode LEα and the lower electrode LEβ and in contact with the lower portion 61 of the partition 6 between the lower electrode LEβ and the lower electrode LEγ; however, may be in contact with one of the lower portions 61. The upper electrode UE14 is separated from the upper electrode UE13 and is located on the organic layer OR14 between the lower electrode LEβ and the lower electrode LEγ. The upper electrode UE15 is separated from the upper electrode UE14, is located on the organic layer OR15, and is in contact with the lower portion 61 of the partition 6 between the lower electrode LEβ and the lower electrode LEγ.

The cap layer CP10 includes a cap layer CP11, a cap layer CP12, a cap layer CP13, a cap layer CP14, and a cap layer CP15.

The cap layer CP11 is located on the upper electrode UE11. The cap layer CP12 is separated from the cap layer CP11 and is located on the upper electrode UE12. The cap layer CP13 is separated from the cap layer CP12 and is located on the upper electrode UE13. The cap layer CP14 is separated from the cap layer CP13 and is located on the upper electrode UE14. The cap layer CP15 is separated from the cap layer CP14 and is located on the upper electrode UE15.

Then, in step ST22, the sealing layer SE10 is formed over the sub-pixel SPα, the sub-pixel SPβ, and the sub-pixel SPγ, as shown in FIG. 10.

The sealing layer SE10 is formed in a manner covering the cap layer CP11, the cap layer CP12, the cap layer CP13, the cap layer CP14, the cap layer CP15, and the partition 6. The sealing layer SE10 covering the partition 6 is in contact with the lower part of the upper portion 62 and the side surface of the lower portion 61. For example, a thickness T10 of the sealing layer SE10 directly above the lower electrode LEα is, for example, 1 μm.

The sealing layer SE10 has a void Vα facing the sub-pixel SPα of the partition 6, a void Vβ, facing the sub-pixel SPβ, of the partition 6, and a void Vγ facing the sub-pixel SPγ of the partition 6.

Here, the process for forming the sealing layer SE10 will be described with reference to FIG. 11. Note that, in FIG. 11, a cross-section of the processing substrate including the sub-pixel SPα and the sub-pixel SPβ, is shown.

Figure 11:
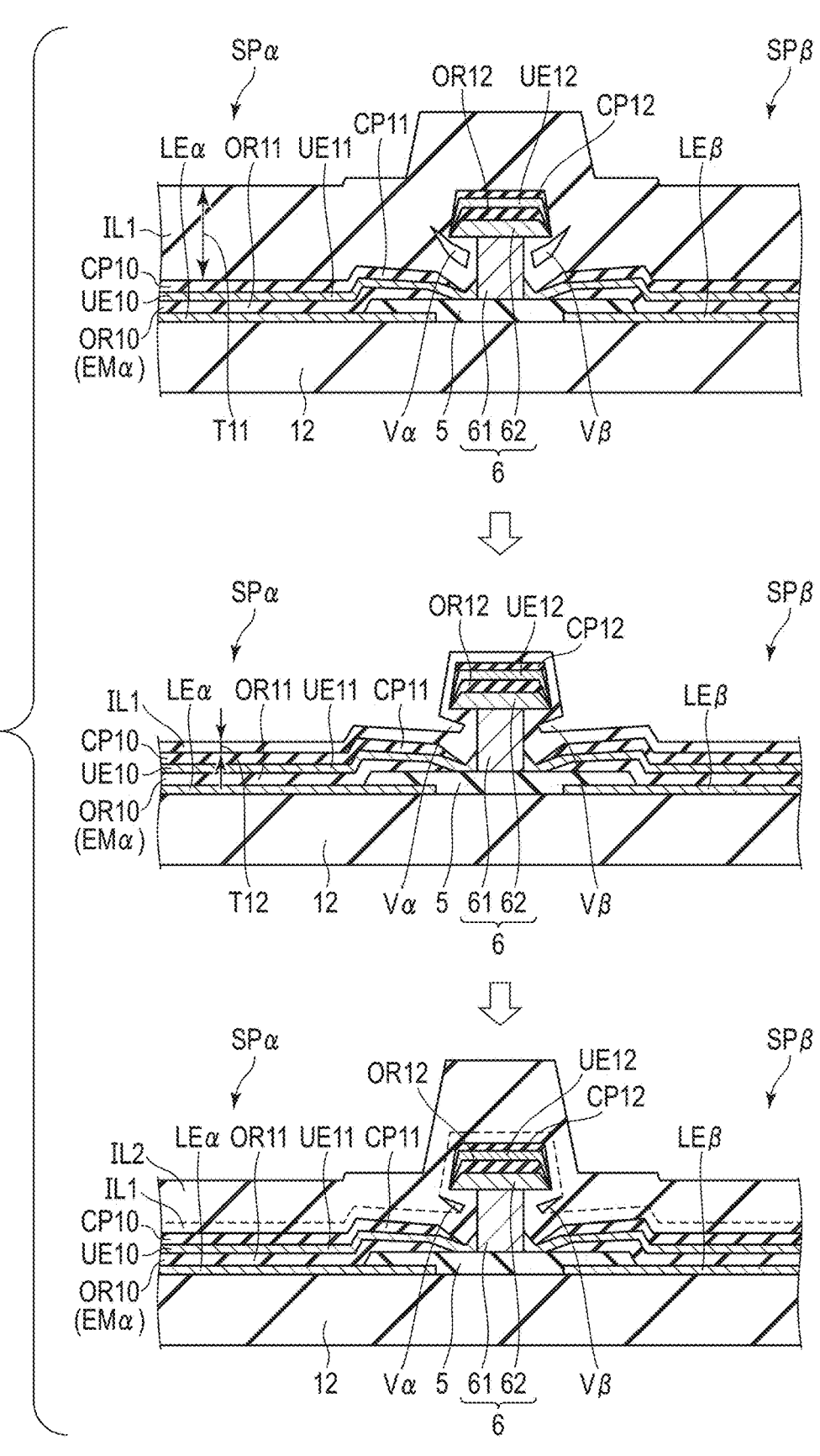
FIG. 11 illustrates step ST22.

First, in step ST221, as shown in the upper part of FIG. 11, the first inorganic insulating layer IL1 is formed. The first inorganic insulating layer IL1 is formed, for example, by silicon nitride. The first inorganic insulating layer IL1 is formed through a chemical-vapor deposition (CVD) process, for example.

Focusing on the first inorganic insulating layer IL1 located in the sub-pixel SPα, the first inorganic insulating layer IL1 is in contact with the cap layers CP11 and CP12, the side surface of the lower portion 61 of the partition 6, and the bottom surface of the upper portion 62 of the partition 6. In addition, the first inorganic insulating layer IL1 has closed voids Vα and Vβ, below the upper portion 62. A thickness T11 of the first inorganic insulating layer IL1 directly above the lower electrode LEα is, for example, 3 μm.

Then, in step ST 222, as shown in the middle part of FIG. 11, anisotropic dry etching of the entire first inorganic insulating layer IL1 is performed without through a resist. In anisotropic dry etching, side etching is less likely to progress compared to isotropic dry etching. Therefore, the film thickness of the first inorganic insulating layer IL1 located directly above the lower electrodes LEα and LEβ is reduced, the film thickness of the first inorganic insulating layer IL1 located directly above the upper portion 62 of the partition 6 is reduced, and the first inorganic insulating layer IL1 on the distal end sides of the respective voids Vα and Vβ, is removed, and the voids Vα and Vβ, are opened. After anisotropic dry etching, a thickness T12 of the first inorganic insulating layer IL1 directly above the lower electrode LEα is, for example, 0.3 μm.

Note that the first inorganic insulating layer IL1 located below the upper portion 62 of the partition 6 is hardly removed. In other words, after anisotropic dry etching is performed, the inorganic insulating layer IL1 covers the side surface of the lower portion 61 of the partition 6 and the bottom surface of the upper portion 62 of the partition 6.

Then, in step ST223, as shown in the lower part of FIG. 11, the second inorganic insulating layer IL2 is formed on the first inorganic insulating layer IL'. The second inorganic insulating layer IL2 is formed, for example, by silicon nitride. The second inorganic insulating layer IL2 is formed through a CVD process, for example. In a case where the first inorganic insulating layer IL1 and the second inorganic insulating layer IL2 are formed of the same material, the interface between them is hardly recognized. In other words, the sealing layer SE10 shown in FIG. 10 is a stacked layer body of the first inorganic insulating layer IL1 and the second inorganic insulating layer IL2; however, can be regarded as a single layer. Therefore, unwanted reflection and scattering of light inside the sealing layer SE10 is suppressed.

In the illustrated example, the sealing layer SE10 has closed voids Vα and Vβ, below the upper portion 62. However, comparing the cross-sectional view of the upper part of FIG. 11 with the cross-sectional view of the lower part of FIG. 11, a cross-sectional area of the void Vα immediately after forming the second inorganic insulating layer IL2 is smaller than that of the void Vα immediately after forming the first inorganic insulating layer IL'. In addition, the void Vα immediately after forming the first inorganic insulating layer IL1 spreads greatly outside of the partition 6 and extends diagonally upward from the lower portion 61 of the partition 6, while the void Vα immediately after forming the second inorganic insulating layer IL2 does not spread much outside of the partition 6 and tends to tilt smaller. The film thickness of the sealing layer SE10 increases on an extension line passing through the distal end of the void Vα, and the occurrence of cracks starting from the void Vα is suppressed.

Similarly, the cross-sectional area of the void Vβ, immediately after forming the second inorganic insulating layer IL2 is smaller than that of the void Vβ, immediately after forming the first inorganic insulating layer IL1.

Figure 12:
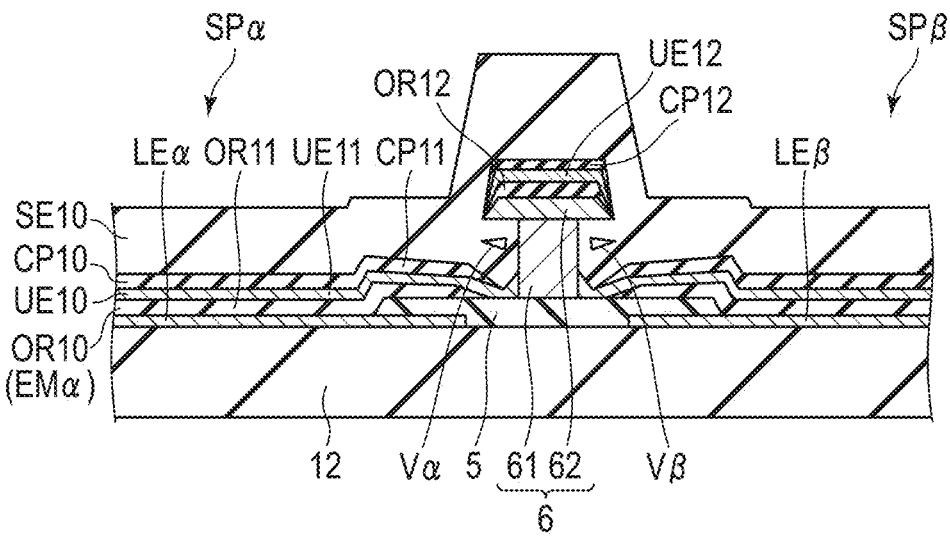
FIG. 12 is a cross-sectional view of the sealing layer SE10 formed through the process described with reference to FIG. 7.

FIG. 12 is a cross-sectional view of the sealing layer SE10 formed through the process described with reference to FIG. 7.

In other words, the sealing layer SE10 is a stacked layer body of the first inorganic insulating layer, the second inorganic insulating layer, and the third inorganic insulating layer. Note that, in the drawing, the reference symbol IL1 of the first inorganic insulating layer, the reference symbol IL2 of the second inorganic insulating layer, and the reference symbol IL3 of the third inorganic insulating layer are not shown. The third inorganic insulating layer is formed, for example, by silicon nitride. The third inorganic insulating layer is formed through a CVD process, for example. In a case where the second inorganic insulating layer and the third inorganic insulating layer are formed of the same material, the interface between them is hardly recognized.

In the illustrated example, the sealing layer SE10 has closed voids Vα and Vβ, below the upper portion 62. However, comparing the cross-sectional view of the lower part of FIG. 11 with the cross-sectional view of FIG. 12, a cross-sectional area of the void Vα immediately after forming the third inorganic insulating layer is smaller than that of the void Vα immediately after forming the second inorganic insulating layer. In addition, the void Vα immediately after forming the third inorganic insulating layer does not spread much outside of the partition 6 and tends to tilt even smaller.

Figure 13:
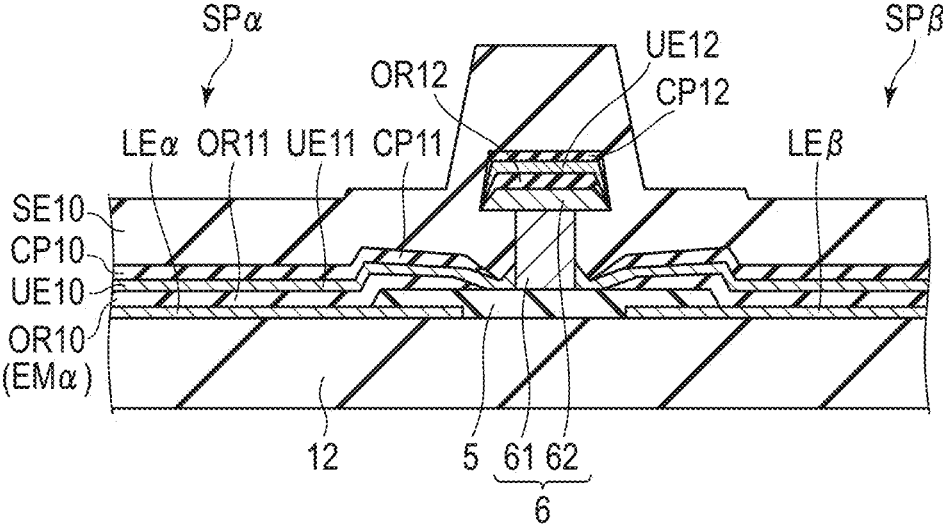
FIG. 13 is another cross-sectional view of the sealing layer SE10 formed through the process described with reference to FIG. 7.

FIG. 13 is another cross-sectional view of the sealing layer SE10 formed through the process described with reference to FIG. 7.

The sealing layer SE10 is identical to the example shown in FIG. 12 in that it is a stacked layer body of the first inorganic insulating layer, the second inorganic insulating layer, and the third inorganic insulating layer.

The sealing layer SE10 is filled below the upper portion 62 without forming a void below the upper portion 62. Thus, since the sealing layer SE10 does not have voids, it is possible to prevent cracks starting from the voids.

The above is a description of step ST22 in which the sealing layer SE10 is formed.

Subsequently, in step ST23, first, a resist 40 is applied over the entire surface on the sealing layer SE10, as shown in FIG. 14. At this time, since the voids Vα, Vβ, and Vγ are all closed, the resist 40 is prevented from flowing into these voids Vα, Vβ, and Vγ. Also, as described with reference to FIG. 13, in the case where the sealing layer SE10 does not have voids, the resist 40 will not flow into unwanted areas.

Then, the resist 40 is patterned.

The resist 40 is, for example, a photosensitive resin and is a positive type that is photosensitive to light irradiation and soluble in a developer. Therefore, a mask having an aperture corresponding to an area where the resist 40 is to be removed is prepared, and the resist 40 is exposed using this mask. Then, the resist 40 is developed using a developer, and the remaining resist is cured. The cured resist corresponds to a first resist 41.

As shown in FIG. 15, the first resist 41 formed by patterning covers the sub-pixel SPα. In other words, the first resist 41 is disposed directly above the lower electrode LEα, the organic layer OR11, the upper electrode UE11, and the cap layer CP11. The first resist 41 extends from the sub-pixel SPα to above the partition 6. Between the sub-pixel SPα and the sub-pixel SPβ, the first resist 41 is disposed on the sub-pixel SPα side (left side of the drawing) and exposes the sealing layer SE10 on the sub-pixel SPβ side (right side of the drawing). In the illustrated example, the first resist 41 exposes the sealing layer SE10 in the sub-pixel SPβ and the sub-pixel SPγ.

Then, in step ST24, as shown in FIG. 16, the sealing layer SE10 exposed from the first resist 41 is removed by dry etching using the first resist 41 as a mask. In the illustrated example, a portion of the sealing layer SE10 that covers the sub-pixel SPα (a portion covering the cap layer CP11) and a portion on the sub-pixel SPα side (left side of the drawing) directly above the partition 6 (a portion of the cap layer CP12 that covers the sub-pixel SPα side) remain. On the other hand, of the portions of the sealing layer SE10, a portion on the sub-pixel SPβ side (right side of the drawing) directly above the partition 6 (a portion of the cap layer CP12 covering the sub-pixel SPβ side), a portion covering the sub-pixel SPβ (a portion covering the cap layer CP13), a portion covering the partition 6 between the sub-pixel SPβ and the sub-pixel SPγ (a portion covering the cap layer CP14), and a portion covering the sub-pixel SPγ (a portion covering cap layer CP15) are removed. As a result, a part of the cap layer CP12, the cap layer CP13, the cap layer CP14, and the cap layer CP15 are exposed from the sealing layer SE10.

Then, in step ST25, as shown in FIG. 17, etching is performed using the first resist 41 as a mask to remove the first thin film 31 exposed from the first resist 41 and the sealing layer SE10. The process of removing the first thin film 31 includes a process of removing a part of the cap layer CP10, a process of removing a part of the upper electrode UE10, and a process of removing a part of the organic layer OR10.

First, etching is performed using the first resist 41 as a mask to remove a part of the cap layer CP10 exposed from the first resist 41 and the sealing layer SE10. In the illustrated example, a part of the cap layer CP12, all of the cap layer CP13, all of the cap layer CP14, and all of the cap layer CP15 are removed.

Then, etching is performed using the first resist 41 as a mask to remove a part of the upper electrode UE10, which is exposed from the first resist 41, the sealing layer SE10, and the cap layer CP10. In the illustrated example, a part of the upper electrode UE12, all of the upper electrode UE13, all of the upper electrode UE14, and all of the upper electrode UE15 are removed.

Then, etching is performed using the first resist 41 as a mask to remove a part of the organic layer OR10, which is exposed from the first resist 41, the sealing layer SE10, the cap layer CP10, and the upper electrode UE10. In the illustrated example, a part of the organic layer OR12, all of the organic layer OR13, all of the organic layer OR14, and all of the organic layer OR15 are removed.

As a result, the lower electrode LEβ is exposed in the sub-pixel SPβ, and the lower electrode LEγ is exposed in the sub-pixel SPγ.

As regards the partition 6 between the sub-pixel SPα and the sub-pixel SPβ, directly above the upper portion 62, the organic layer OR12, the upper electrode UE12, the cap layer CP12, and the sealing layer SE10 remain on the sub-pixel SPα side, and the organic layer OR12, the upper electrode UE12, the cap layer CP12, and the sealing layer SE10 are removed on the sub-pixel SPβ side. Therefore, the sub-pixel SPβ side of the partition 6 is exposed.

The partition 6 between the sub-pixel SPβ and the sub-pixel SPγ is also exposed.

Then, in step ST26, the first resist 41 is removed as shown in FIG. 18. As a result, the sealing layer SE10 is exposed in the sub-pixel SPα. Through these steps ST21 to ST26, the display element 21 is formed in the sub-pixel SPα. The display element 21 is configured by the lower electrode LEα, the organic layer OR11 including the light emitting layer EMα, the upper electrode UE11, and the cap layer CP11. The display element 21 is covered by the sealing layer SE10.

On the partition 6 between the sub-pixel SPα and the sub-pixel SPβ, a stacked layer body of the organic layer OR12 including the light emitting layer EMα, the upper electrode UE12, and the cap layer CP12 is formed, which is covered by the sealing layer SE10. In addition, a portion of the partition 6 on the sub-pixel SPα side is covered with the sealing layer SE10.

The sub-pixel SPα in the above example is one of the sub-pixels SP1, SP2, and SP3 shown in FIG. 2. For example, in a case where the sub-pixel SPα corresponds to the sub-pixel SP1, the lower electrode LEα corresponds to the first lower electrode LE1, the organic layer OR11 corresponds to the first portion OR1a of the first organic layer OR1, the organic layer OR12 corresponds to the second portion OR1b of the first organic layer OR1, the light emitting layer EMα corresponds to the first light emitting layer EM1, the upper electrode UE11 corresponds to the first portion UE1a of the first upper electrode UE1, the upper electrode UE12 corresponds to the second portion UE1b of the first upper electrode UE1, the cap layer CP11 corresponds to the first portion CP1a of the first cap layer CP1, the cap layer CP12 corresponds to the second portion CP1b of the first cap layer CP1, and the sealing layer SE10 corresponds to sealing layer SE1.

Here, a case in which the resist 40 flows below the upper portion 62 of the partition 6 in the process of patterning the resist 40 will be described. As described above, in the case where the resist 40 is a positive type, the resist 40 located below the upper portion 62 will be shaded by the upper portion 62 and will not be exposed to light; therefore, will remain after development. Therefore, the sealing layer SE10 overlapping the residual resist 40 may not be sufficiently removed in the subsequent dry etching process and may remain. In addition, there is a risk that products may appear due to carbon and other substances contained in the residual resist 40, in the dry etching process.

For example, in the above example, in a case where the resist 40 remains in the partition 6 between the sub-pixels SPβ and SPγ, or the products adhere to the partition 6, the sealing layer SE10 may remain on the side surface of the lower portion 61, and may cause poor electrical connection between the upper electrodes of the sub-pixels SPβ and SPγ and the lower portion 61. In addition, when forming the sub-pixel SPβ or the sub-pixel SPγ, cracks may occur in the sealing layer, resulting in sealing defects.

According to the present embodiment, the flow of the resist 40 below the upper portion 62 of the partition 6 is suppressed. Therefore, in the dry etching process of the sealing layer SE10, the sealing layer SE10 of the sub-pixel not covered by the first resist 41 or the sealing layer SE10 covering the partition 6 is reliably removed. Moreover, the appearance of unwanted products is suppressed. Therefore, in the sub-pixel formation process at a later stage, the upper electrode and the lower portion 61 of the partition 6 are electrically connected in a reliable manner. In addition, in the sub-pixel formation process at a later stage, the display element is reliably sealed by the sealing layer, and the formation of unwanted holes (moisture infiltration path) is suppressed. Therefore, the degradation of reliability can be suppressed.

According to various investigations by the inventor, it was confirmed that when the thickness of the sealing layer SE10 formed through multiple CVD processes is set to 0.5 μm or more (or 0.5 times or more the thickness T61), a closed void is formed in the sealing layer SE10 or the formation of a void is suppressed.

In addition, in the case where the sealing layer SE10 is formed through multiple CVD processes, even if voids are formed, the cross-sectional area of the voids can be reduced compared to the voids in the sealing layer formed through a single CVD process. Therefore, the generation of cracks starting from the voids is suppressed.

In addition, the thickness of the sealing layer overlapping the lower electrode is set to less than 2 μm (or less than twice the thickness T61 of the lower 61), which can suppress the decrease in transmittance of light emitted from the display element.

In addition, the interface of the stacked inorganic insulating layers is hardly recognized in the sealing layer SE10 after multiple CVD processes. Therefore, unwanted reflections and scattering inside the sealing layer SE10 can be suppressed.

As described above, according to the present embodiment, it is possible to provide a display device and a method for manufacturing a display device that can suppress the degradation of reliability and improve the manufacturing yield.

Based on the display device and the method for manufacturing the display device, which have been described in the above-described embodiments, a person having ordinary skill in the art may achieve a display device and a method for manufacturing the display device with an arbitral design change; however, as long as they fall within the scope and spirit of the present invention, such a display device and method of manufacturing the display device will be encompassed by the scope of the present invention.

A skilled person would conceive various changes and modifications of the present invention within the scope of the technical concept of the invention, and naturally, such changes and modifications are encompassed by the scope of the present invention. For example, if a skilled person adds/deletes/alters a structural element or design to/from/in the above-described embodiments, or adds/deletes/alters a step or a condition to/from/in the above-described embodiment, as long as they fall within the scope and spirit of the present invention, such addition, deletion, and altercation are encompassed by the scope of the present invention.

Furthermore, regarding the present embodiments, any advantage and effect those will be obvious from the description of the specification or arbitrarily conceived by a skilled person are naturally considered achievable by the present invention.

What is claimed is:

1. A display device comprising:
a substrate;
a first lower electrode and a second lower electrode disposed above the substrate;
a rib including a first aperture overlapping the first lower electrode and a second aperture overlapping the second lower electrode;
a partition including a lower portion disposed on the rib between the first aperture and the second aperture and an upper portion disposed on the lower portion and projecting from a side surface of the lower portion;
a first organic layer disposed on the first lower electrode in the first aperture and including a first light emitting layer;
a second organic layer disposed on the second lower electrode in the second aperture and including a second light emitting layer formed of a different material from the first light emitting layer;
a first upper electrode disposed on the first organic layer and in contact with the lower portion of the partition;
a second upper electrode disposed on the second organic layer and in contact with the lower portion of the partition;
a first sealing layer disposed above the first upper electrode and in contact with the lower portion of the partition;

a second sealing layer disposed above the second upper electrode, in contact with the lower portion of the partition, and separated from the first sealing layer;

a first cap layer disposed on the first upper electrode and covered by the first sealing layer; and a second cap layer disposed on the second upper electrode and covered by the second sealing layer, wherein a thickness of the first sealing layer directly above the first lower electrode is 0.5 times or more, and less than twice a thickness of the lower portion of the partition, each of the first organic layer, the first upper electrode, and the first cap layer includes a first portion located below the upper portion of the partition and a second portion located on the upper portion of the partition and separated from the first portion, the first sealing layer is in contact with the first portion and the second portion of the first cap layer, each of the second organic layer, the second upper electrode, and the second cap layer includes a first portion located below the upper portion of the partition and a second portion located on the upper portion of the partition and separated from the first portion, the second sealing layer is in contact with the first portion and the second portion of the second cap layer, the second portion of the first organic layer is separated from the second portion of the second organic layer, the second portion of the first upper electrode is separated from the second portion of the second upper electrode, and the second portion of the first cap layer is separated from the second portion of the second cap layer.

2. The display device of claim 1, wherein the thickness of the first sealing layer is 0.5 μm or more, and less than 2 μm.

3. The display device of claim 1, wherein the first sealing layer and the second sealing layer are formed of an inorganic insulating material.

4. The display device of claim 1, wherein the first sealing layer and the second sealing layer are formed of silicon nitride.

5. The display device of claim 1, wherein each of the first sealing layer and the second sealing layer includes a closed void below the upper portion of the partition.

6. The display device of claim 1, wherein each of the first sealing layer and the second sealing layer is filled below the upper portion of the partition without forming a void.

7. A display device comprising:

a substrate;

a first lower electrode and a second lower electrode disposed above the substrate and arranged in a first direction;

a rib including a first aperture overlapping the first lower electrode and a second aperture overlapping the second lower electrode;

a partition including a lower portion disposed on the rib between the first aperture and the second aperture and an upper portion disposed on the lower portion and projecting from a side surface of the lower portion;

a first organic layer disposed on the first lower electrode in the first aperture and including a first light emitting layer;

a second organic layer disposed on the second lower electrode in the second aperture and including a second light emitting layer formed of a different material from the first light emitting layer;

a first upper electrode disposed on the first organic layer and in contact with the lower portion of the partition;

a second upper electrode disposed on the second organic layer and in contact with the lower portion of the partition;

a first sealing layer disposed above the first upper electrode, in contact with the lower portion of the partition, extending above the upper portion of the partition, and including a first end portion above the upper portion of the partition; and a second sealing layer disposed above the second upper electrode, in contact with the lower portion of the partition, extending above the upper portion of the partition, and including a second end portion above the upper portion of the partition;

wherein a thickness of the first sealing layer directly above the first lower electrode is 0.5 times or more, and less than twice a thickness of the lower portion of the partition, and the first end portion of the first sealing layer and the second end portion of the second sealing layer are spaced apart from each other in the first direction.

8. The display device of claim 7, further comprising:

a protective layer on the first sealing layer and the second sealing layer, wherein the first end portion of the first sealing layer and the second end portion of the second sealing layer form a first gap, and the first gap is filled with the protective layer.

9. The display device of claim 8, wherein the protective layer is in direct contact with the upper portion of the partition.

10. The display device of claim 7, wherein the lower portion of the partition includes a lower surface, and an upper surface opposing the lower surface and being further from the substrate compared with the lower surface, the side surface of the lower portion of the partition connects the lower surface of the lower portion of the partition to the upper surface of the lower portion of the partition, the upper portion of the partition includes a lower surface in direct contact with the upper surface of the lower portion of the partition, a width of the lower surface of the upper portion of the partition in the first direction is greater than a width of the upper surface of the lower portion of the partition in the first direction, the first sealing layer is in direct contact with the side surface of the lower portion of the partition and the lower surface of the upper portion of the partition, and the second sealing layer is in direct contact with the side surface of the lower portion of the partition and the lower surface of the upper portion of the partition.

* * * * *